US012695058B2

(12) United States Patent
Martinez et al.

(10) Patent No.: US 12,695,058 B2
(45) Date of Patent: Jul. 28, 2026

(54) PLASMA PROCESS CONTROL OF MULTI-ELECTRODE SYSTEMS EQUIPPED WITH ION ENERGY SENSORS

(71) Applicant: MKS Inc., Andover, MA (US)

(72) Inventors: Linnell Martinez, Lakeland, FL (US); David Miller, Rochester, NY (US); Aaron Radomski, Conesus, NY (US)

(73) Assignee: MKS Inc., Andover, MA (US)

( * ) Notice: Subject to any disclaimer, the term of this patent is extended or adjusted under 35 U.S.C. 154(b) by 161 days.

(21) Appl. No.: 17/884,711

(22) Filed: Aug. 10, 2022

(65) Prior Publication Data

US 2024/0055228 A1 Feb. 15, 2024

(51) Int. Cl.
*H01J 37/32* (2006.01)

(52) U.S. Cl.
CPC .. *H01J 37/32174* (2013.01); *H01J 37/32935* (2013.01); *H01J 2237/24564* (2013.01); *H01J 2237/24585* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,624,456 A * | 4/1997 | Hellenkamp | ........... | A61F 9/013 |
| | | | | 606/166 |
| 7,602,127 B2 * | 10/2009 | Coumou | ........... | H01J 37/32174 |
| | | | | 315/111.41 |
| 8,110,991 B2 * | 2/2012 | Coumou | ........... | H01J 37/32082 |
| | | | | 315/111.41 |
| 8,395,322 B2 * | 3/2013 | Coumou | ........... | H01J 37/32082 |
| | | | | 315/111.41 |
| 9,041,292 B2 * | 5/2015 | Coumou | ........... | H01J 37/32174 |
| | | | | 315/111.41 |

(Continued)

FOREIGN PATENT DOCUMENTS

| | | | | |
|---|---|---|---|---|
| BR | 7602127 A | * 10/1976 | ........ | C09B 29/0003 |
| JP | 2011228436 A | 11/2011 | | |

(Continued)

OTHER PUBLICATIONS

Taiwanese Office Action regarding Patent Application No. 112122280, dated Jun. 11, 2024.

(Continued)

*Primary Examiner* — Srinivas Sathiraju
(74) *Attorney, Agent, or Firm* — Kurt Eaton

(57) ABSTRACT

A RF generator includes a first RF power source configured to output a first RF output signal to a first electrode of a load. The RF generator includes a first sensor for detecting a first parameter of the first RF output signal and determining a first characteristic of a plasma in the load. A second RF power source outputs a second RF output signal to a second electrode. A second sensor detects a second parameter of the second RF output signal and determines a second characteristic of a plasma in the load. A RF power controller receives the first characteristic and the second characteristic and generates a first control signal and a second control signal. The first control signal adjusts the first RF output signal, and the second control signal adjusts the second RF output signal.

36 Claims, 10 Drawing Sheets

(56) References Cited

U.S. PATENT DOCUMENTS

| | | | | |
|---|---|---|---|---|
| 9,210,790 | B2 * | 12/2015 | Hoffman | C23C 14/345 |
| 9,525,412 | B2 * | 12/2016 | Mavretic | H03H 7/40 |
| 9,578,731 | B2 * | 2/2017 | Van Zyl | H01J 37/32935 |
| 9,704,690 | B2 * | 7/2017 | Kim | H01J 37/321 |
| 9,947,514 | B2 * | 4/2018 | Radomski | H01J 37/32183 |
| 9,966,236 | B2 * | 5/2018 | Long | H01J 37/32651 |
| 10,049,857 | B2 | 8/2018 | Fisk, II et al. | |
| 10,395,895 | B2 * | 8/2019 | Coumou | H01J 37/32155 |
| 10,431,434 | B2 * | 10/2019 | Long | H01J 37/32651 |
| 10,546,724 | B2 * | 1/2020 | Radomski | H01J 37/321 |
| 10,553,407 | B2 * | 2/2020 | Nagami | H01J 37/32697 |
| 10,607,813 | B2 * | 3/2020 | Fairbairn | H01J 37/32146 |
| 10,692,698 | B2 * | 6/2020 | Coumou | H01J 37/32091 |
| 10,727,059 | B2 * | 7/2020 | Bobek | C23C 16/26 |
| 10,791,617 | B2 * | 9/2020 | Dorf | H01J 37/32174 |
| 10,821,542 | B2 * | 11/2020 | Nelson | B23K 20/004 |
| 10,930,470 | B2 * | 2/2021 | Radomski | H01J 37/321 |
| 11,158,488 | B2 * | 10/2021 | Radomski | H01J 37/32155 |
| 11,476,090 | B1 * | 10/2022 | Ramaswamy | H01J 37/32128 |
| 11,527,384 | B2 * | 12/2022 | Burry | H01J 37/32155 |
| 11,531,312 | B2 * | 12/2022 | Coumou | G05B 19/042 |
| 11,536,755 | B2 * | 12/2022 | Fisk, II | G01R 31/14 |
| 11,798,790 | B2 * | 10/2023 | Cui | H01J 37/32715 |
| 11,875,972 | B2 * | 1/2024 | Driessen | H01J 37/32174 |
| 11,887,812 | B2 * | 1/2024 | Nguyen | H01J 37/32128 |
| 11,901,157 | B2 * | 2/2024 | Cui | C23C 16/4586 |
| 11,935,726 | B2 * | 3/2024 | Radomski | H01J 37/32146 |
| 11,972,932 | B2 * | 4/2024 | Nakahata | H01J 37/32577 |
| 11,996,274 | B2 * | 5/2024 | Martinez | H01J 37/32128 |
| 12,183,557 | B2 * | 12/2024 | Cui | H01J 37/32697 |
| 2009/0315463 | A1 * | 12/2009 | Coumou | H05H 1/46 |
| | | | | 315/111.21 |
| 2010/0018648 | A1 * | 1/2010 | Collins | H01J 37/32642 |
| | | | | 156/345.24 |
| 2010/0194195 | A1 * | 8/2010 | Coumou | H01J 37/32174 |
| | | | | 307/24 |
| 2012/0013253 | A1 * | 1/2012 | Coumou | H01J 37/32082 |
| | | | | 315/111.21 |
| 2012/0138229 | A1 * | 6/2012 | Sakka | H01J 37/32642 |
| | | | | 156/345.33 |
| 2012/0322270 | A1 * | 12/2012 | Long | H01J 37/32651 |
| | | | | 156/345.35 |
| 2014/0055034 | A1 * | 2/2014 | Coumou | H01J 37/32082 |
| | | | | 315/111.21 |
| 2014/0263199 | A1 * | 9/2014 | Nelson | H01J 37/32082 |
| | | | | 219/121.4 |
| 2017/0062186 | A1 * | 3/2017 | Coumou | H01J 37/32165 |
| 2017/0062187 | A1 * | 3/2017 | Radomski | H01J 37/32155 |
| 2018/0005802 | A1 * | 1/2018 | Chen | H01J 37/32174 |
| 2018/0226233 | A1 * | 8/2018 | Long | H01J 37/32651 |
| 2018/0330921 | A1 * | 11/2018 | Radomski | H01J 37/321 |
| 2019/0057845 | A1 * | 2/2019 | Nagami | H01J 37/32697 |
| 2019/0088452 | A1 * | 3/2019 | Yamada | H01J 37/3299 |
| 2019/0157040 | A1 * | 5/2019 | Fairbairn | H01J 37/32146 |
| 2019/0318915 | A1 * | 10/2019 | Nagami | H01J 37/32091 |
| 2019/0333744 | A1 * | 10/2019 | Nagami | H01J 37/32935 |
| 2020/0144025 | A1 * | 5/2020 | Radomski | H01J 37/321 |
| 2020/0144031 | A1 * | 5/2020 | Tamamushi | H01J 37/32449 |
| 2020/0411289 | A1 * | 12/2020 | Radomski | H01J 37/32174 |
| 2021/0020404 | A1 * | 1/2021 | Savas | H01J 37/32091 |
| 2021/0050185 | A1 * | 2/2021 | Martinez | H01J 37/32146 |
| 2021/0327681 | A1 * | 10/2021 | Koshimizu | H01J 37/32128 |
| 2021/0373054 | A1 | 12/2021 | Fisk, II et al. | |
| 2022/0005674 | A1 * | 1/2022 | Radomski | H01J 37/32174 |
| 2022/0084792 | A1 * | 3/2022 | Savas | H01J 37/32183 |
| 2022/0157561 | A1 * | 5/2022 | Cui | C23C 16/4586 |
| 2022/0157577 | A1 * | 5/2022 | Cui | H01J 37/32706 |
| 2022/0165545 | A1 * | 5/2022 | Burry | H01J 37/32155 |
| 2022/0216036 | A1 * | 7/2022 | Koshimizu | H01J 37/32128 |
| 2023/0041177 | A1 * | 2/2023 | Smyka | H01J 37/32183 |
| 2023/0050119 | A1 * | 2/2023 | Martinez | H01J 37/32183 |
| 2023/0071168 | A1 * | 3/2023 | Ramaswamy | H01J 37/32091 |
| 2023/0154729 | A1 * | 5/2023 | Na | H01J 37/32183 |
| | | | | 438/798 |
| 2023/0215695 | A1 * | 7/2023 | Le | H01J 37/3211 |
| | | | | 315/111.21 |
| 2023/0230804 | A1 * | 7/2023 | Bhowmick | H01J 37/32165 |
| | | | | 315/111.21 |
| 2023/0317427 | A1 * | 10/2023 | Son | H01J 37/3211 |
| | | | | 216/67 |
| 2023/0326721 | A1 * | 10/2023 | Smyka | H01J 37/32155 |
| | | | | 315/111.21 |
| 2023/0326727 | A1 * | 10/2023 | Martinez | H01J 37/32128 |
| 2024/0055228 | A1 * | 2/2024 | Martinez | H01J 37/3299 |

FOREIGN PATENT DOCUMENTS

| | | | |
|---|---|---|---|
| JP | 2021503700 | A5 | 12/2021 |
| JP | 2023517495 | A | 4/2023 |
| JP | 2025502429 | A | 1/2025 |
| KR | 10-1246566 | B1 | 3/2013 |
| KR | 10-20140119341 | A | 10/2014 |
| KR | 1020140144534 | A | 12/2014 |
| TW | 201717247 | A | 5/2017 |
| TW | 202213425 | A | 4/2022 |

OTHER PUBLICATIONS

International Search Report and Written Opinion of the ISA, issued in PCT/US2023/024657, mailed Sep. 22, 2023; ISA/US (12 pages).

Translation of Office Action issued in KR counterpart application No. 10-2025-7003216 dated Feb. 19, 2026.

Office Action issued in TW counterpart application No. 114109424 dated Sep. 23, 2025 (9 pages).

Office Action issued in JP counterpart application No. 2025-502429 dated Oct. 14, 2025 (9 pages).

* cited by examiner

PLASMA PROCESS CONTROL OF MULTI-ELECTRODE SYSTEMS EQUIPPED WITH ION ENERGY SENSORS

FIELD

The present disclosure relates to RF generator systems and to control of RF generators.

BACKGROUND

Plasma processing is frequently used in semiconductor fabrication. In plasma processing, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One general aspect includes a RF generator including a first RF power source configured to output a first RF output signal to a first electrode of a load. The generator also includes a first sensor for detecting a first parameter of the first RF output signal and determining a first characteristic of a plasma in the load. The generator also includes a second RF power source configured to output a second RF output signal to a second electrode. The generator also includes a second sensor for detecting a second parameter of the second RF output signal and determining a second characteristic of a plasma in the load. The generator also includes a RF power controller configured to receive the first characteristic and the second characteristic and to generate a first control signal and configured to generate a second control signal. The generator also includes where the first control signal adjusts the first RF output signal, and the second control signal varies adjusts the second RF output signal. Other embodiments of this aspect include corresponding computer systems, apparatus, and computer programs recorded on one or more computer storage devices, each configured to perform the actions of the methods.

Implementations may include one or more of the following features. The RF generator where: the first sensor is a plasma sensor, and the first characteristic is at least one of a plasma density, an electron temperature, an ion potential, a sheath thickness, a sheath capacitance, or an ion energy distribution function (IEDF) associated with the first electrode; and the second sensor is a plasma sensor, and the second characteristic is at least one of the plasma density, the electron temperature, the ion potential, or the ion energy distribution function (IEDF) associated with the second electrode. The first characteristic is an IEDF associated with the first electrode. The second characteristic is an IEDF associated with the second electrode. The first characteristic is an IEDF associated with the first electrode, and the second characteristic is the IEDF associated with the second electrode. The RF power controller may include a first power controller and a second power controller, where the first power controller is configured to receive the first characteristic and to generate a first control signal to vary the first RF output signal, and the second power controller is configured to receive the second characteristic and to generate a second control signal to vary the second RF output signal. The RF generator may include a communication link between the first power controller and the second power controller, and the first power controller and the second power controller are configured to communicate a setting that defines the respective first RF output signal and the second RF output signal. The first RF power source is a main bias power source and the first electrode is a main bias electrode, and the second RF power source is an auxiliary bias power source and the second electrode is an auxiliary bias electrode, where the main bias electrode and the auxiliary bias electrode form a composite bias electrode. The first control signal controls at least one of a rail voltage, a drive, a frequency, a phase, or a pulsing of the first RF output signal, and the second control signal controls at least one of a rail voltage, a drive, a frequency, a phase, or a pulsing of the second RF output signal. The RF generator may include a third RF power source configured to output a third RF output signal to a third electrode, and the RF power controller is further configured to generate a third control signal to vary the third RF output signal. The RF power controller is configured to generate the third control signal, and the third control signal is varied in accordance with at least one of the first characteristic or the second characteristic. The third RF power source is a source power source, and the third electrode is a source electrode. Implementations of the described techniques may include hardware, a method or process, or computer software on a computer-accessible medium.

One general aspect includes a RF system including a main bias RF generator, including: a main bias power source configured to output a main bias RF output signal to a main bias electrode of a load, a main bias plasma sensor configured to detect a main bias parameter of the main bias RF output signal and to determine a main bias characteristic of a plasma in the load. The system also includes an auxiliary bias RF generator, including: an auxiliary bias RF power source configured to output an auxiliary bias RF output signal to an auxiliary bias electrode, an auxiliary bias plasma sensor configured to detect an auxiliary bias parameter of the auxiliary bias RF output signal and to determine an auxiliary bias characteristic of a plasma in the load. The system also includes a RF power controller configured to receive the main bias characteristic and the auxiliary bias characteristic and to generate a main bias control signal to vary the main bias RF output signal and configured to generate an auxiliary bias control signal to vary the auxiliary bias RF output signal. Other embodiments of this aspect include corresponding computer systems, apparatus, and computer programs recorded on one or more computer storage devices, each configured to perform the actions of the methods.

Implementations may include one or more of the following features. The RF system where the RF power controller is one of a proportional-integral controller, a proportional-integral-derivative controller, or a linear-quadratic-response controller. The RF system where the main bias plasma sensor includes one of a VI probe or directional coupler to detect the main bias parameter, and the auxiliary bias plasma sensor includes one of a VI probe or directional coupler to detect the auxiliary bias parameter. The RF system where the main bias characteristic is one of plasma density, electron temperature, ion potential, a sheath thickness, a sheath capacitance, or ion energy distribution function (IEDF) associated with the main bias electrode; and the auxiliary bias characteristic is one of plasma density, electron temperature, ion potential, or ion energy distribution function (IEDF) associated with the auxiliary bias electrode. The RF power controller may include a main bias power controller and an auxiliary bias power controller, where the main bias power controller is configured to receive the main bias characteristic and to generate the main bias control signal in accordance with the main bias characteristic, and the auxiliary bias power controller is configured to receive the auxiliary bias characteristic and to generate the auxiliary bias control signal in accordance with the main bias characteristic. The main bias electrode and the auxiliary bias electrode form a composite bias electrode. The main bias control signal controls at least one of a rail voltage, a drive, a frequency, a phase, or a pulsing of the main bias RF output signal, and the auxiliary bias control signal controls at least one of a rail voltage, a drive, a frequency, a phase, or a pulsing of the auxiliary bias RF output signal. The RF system where one of the main bias characteristic and the auxiliary bias characteristic includes a plurality of plasma density, electron temperature, ion potential, or ion energy distribution function (IEDF) associated with the respective main bias electrode and the auxiliary bias electrode; and the other of the main bias characteristic and the auxiliary bias characteristic includes a plurality of plasma density, electron temperature, ion potential, or ion energy distribution function (IEDF) associated with other of the respective main bias electrode and the auxiliary bias electrode. The RF system may include a source RF power source configured to output a source RF output signal to a source electrode, and the RF power controller is further configured to generate a source control signal to vary the source RF output signal. The RF system where one of the main bias characteristic and the auxiliary bias characteristic includes a plurality of plasma density, electron temperature, ion potential, or ion energy distribution function (IEDF) associated with the respective main bias electrode and the auxiliary bias electrode; and the other of the main bias characteristic and the auxiliary bias characteristic includes a plurality of plasma density, electron temperature, ion potential, or ion energy distribution function (IEDF) associated with other of the respective main bias electrode and the auxiliary bias electrode. The RF power controller is configured to generate the source control signal, and the source control signal is varied in accordance with at least one of the main bias characteristic or the auxiliary bias characteristic. The main bias characteristic is an IEDF associated with the main bias electrode. The auxiliary bias characteristic is an IEDF associated with the auxiliary bias electrode. The main bias characteristic is an IEDF associated with the main bias electrode, and the auxiliary bias characteristic is the IEDF associated with the auxiliary bias electrode. Implementations of the described techniques may include hardware, a method or process, or computer software on a computer-accessible medium.

One general aspect includes a non-transitory computer-readable medium storing processor-executable instructions. The non transitory computer readable medium storing processor executable instructions also includes generating a main bias RF output signal to a main bias electrode of a load. The instructions also include detecting a main bias parameter of the main bias RF output signal and determining a main bias characteristic of a plasma in the load. The instructions also include generating an auxiliary bias RF output signal to an auxiliary bias electrode of a load. The instructions also include detecting an auxiliary bias parameter of the auxiliary bias RF output signal and determining an auxiliary bias characteristic of a plasma in the load. The instructions also include receive the main bias characteristic and the auxiliary bias characteristic and generating a main bias control signal to vary the main bias RF output signal in accordance with the main bias parameter and generating an auxiliary bias control signal to vary the auxiliary bias RF output signal in accordance with the main bias characteristic. The instructions also includes where the main bias control signal adjusts the main bias RF output signal, and the auxiliary bias control signal adjusts the auxiliary bias RF output signal. Other embodiments of this aspect include corresponding computer systems, apparatus, and computer programs recorded on one or more computer storage devices, each configured to perform the actions of the methods.

Implementations may include one or more of the following features. The non-transitory computer-readable medium storing processor-executable instructions where: the main bias characteristic is at least one of plasma density, electron temperature, ion potential, a sheath thickness, a sheath capacitance, or ion energy distribution function (IEDF) associated with the main bias electrode; and the auxiliary bias characteristic is at least one of plasma density, electron temperature, ion potential, a sheath thickness, a sheath capacitance, or ion energy distribution function (IEDF) associated with the auxiliary bias electrode. The main bias electrode and the auxiliary bias electrode form a composite bias electrode. The main bias control signal controls at least one of rail voltage, drive, frequency, phase, or pulsing of the main bias RF output signal, and the auxiliary bias control signal controls at least one of rail voltage, drive, frequency, phase, or pulsing of the auxiliary bias RF output signal. The non-transitory computer-readable medium storing processor-executable instructions wherein the instructions may include generating one of the main bias characteristic and the auxiliary bias characteristic includes at least two of plasma density, electron temperature, ion potential, or ion energy distribution function (IEDF) associated with the respective main bias electrode and the auxiliary bias electrode; and the other of the main bias characteristic and the auxiliary bias characteristic includes at least one of plasma density, electron temperature, ion potential, or ion energy distribution function (IEDF) associated with other of the respective main bias electrode and the auxiliary bias electrode. The non-transitory computer-readable medium storing processor-executable instructions the instructions may include generating a source RF output signal to a source electrode and generating a source control signal to vary the source RF output signal. The non-transitory computer-readable medium storing processor-executable instructions, wherein the instructions may include generating one of the main bias characteristic and the auxiliary bias characteristic includes a plurality of plasma density, electron temperature, ion potential, or ion energy distribution function (IEDF) associated with the respective main bias electrode and the auxiliary bias electrode; and the other of the main bias characteristic and the auxiliary bias characteristic includes a plurality of plasma density, electron temperature, ion potential, or ion energy distribution function (IEDF) associated with other of the respective main bias electrode and the auxiliary bias electrode. The non-transitory computer-readable medium storing processor-executable instructions the instructions may include varying the source control signal in accordance with at least one of the main bias characteristic or the auxiliary bias characteristic. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figures 1, 2:
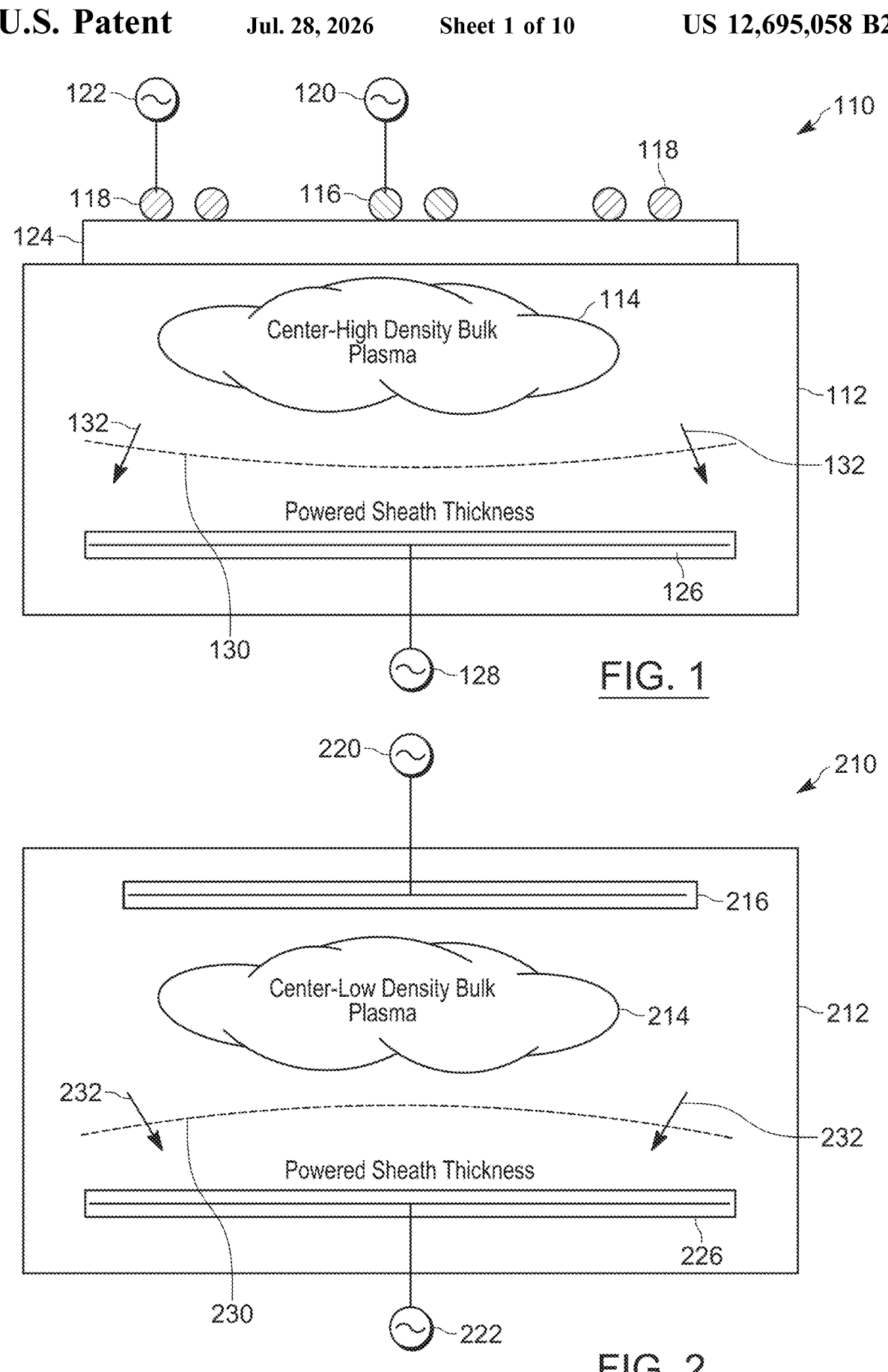
FIG. 1 shows a representation of a plasma processing system having a center-high plasma density.
FIG. 2 shows a representation of a plasma processing system having a center-low plasma density.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit transforms a load impedance to a characteristic impedance of a transmission line between the power generator and the matching network. The impedance matching aids in maximizing an amount of power forwarded to the load ("forward power") and minimizing an amount of power reflected back from the load to the power generator ("reverse power" or "reflected power"). Forward power may be maximized and reverse power may be minimized when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse or pulsed mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The IEDF can be controlled with the bias power. One way of controlling the IEDF for a system in which multiple RF power signals are applied to the load occurs by varying multiple RF signals that are related by at least one of amplitude, frequency and phase. The related at least one of amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the other power generator (the bias) controls ion energy. Examples of dual power systems include systems that are described in U.S. Pat. Nos. 7,602,127; 8,110,991; and 8,395,322, referenced above. The dual power system described in the above-referenced patents employs a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide process space to support material surface interaction. In one responsive approach in an inductively coupled plasma system, controlling power applied to a source electrode controls the plasma density while controlling power applied to the bias electrode modulates ions to control the IEDF to provide etch rate and etch feature profile control. By using source electrode and bias electrode control, the etch rate and other various etch characteristics are controlled via the ion density and energy.

As integrated circuit and device fabrication continues to evolve, so do the power requirements for controlling the process for fabrication. For example, with memory device fabrication, the requirements for bias power continue to increase. Increased power generates higher and more energetic ions for increased directionality or anisotropic etch feature profiles and faster surface interaction, thereby increasing the etch rate and allowing higher aspect ratio features to be etched. In RF systems, increased ion energy is sometimes accompanied by a lower bias frequency requirement along with an increase in the power and number of bias power sources coupled to the plasma sheath created in the plasma chamber. The increased power at a lower bias frequency and the increased number of bias power sources results in intermodulation distortion (IMD) from a sheath modulation. The IMD emissions can significantly reduce power delivered by the source where plasma generation occurs. U.S. Pat. No. 10,821,542, issued Nov. 3, 2020 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

FIG. 1 depicts a representation of an inductively coupled plasma (ICP) system 110. ICP system 110 includes a non-linear load, such as a reactor, plasma reactor, or plasma chamber 112, which will be referred to interchangeably herein, for generating plasma 114. Power in the form of voltage or current is applied to plasma chamber 112 via coils, including a coil assembly that in various configurations includes one or multiple coils arranged in various configurations. In one nonlimiting arrangement shown in FIG. 1, plasma chamber 112 includes one or both a first coil 116 and second coil 118. In various configurations, multiple coils may be arranged concentrically, intertwined, or in a spiral configuration. Power is applied to first coil 116 via RF power generator or power source 120, and power is applied to second coil 118 via RF power generator or power source 122. Coils 116 and 118 are arranged to provide power to plasma chamber 112. A dielectric window 124 enables power to couple through to the plasma while providing a vacuum seal. A substrate or wafer (not shown) is placed in plasma chamber 112 and typically forms the work piece that is the subject of plasma operations. An RF power generator, power supply, or power source 128 (the terms may be used herein interchangeably) applies power to plasma chamber 112 via electrode 126, which supports the substrate.

In various configurations, power sources 120, 122 provide a source voltage or current to ignite or generate plasma 114 or control the plasma density. Also in various configurations, power source 128 provides a bias voltage or current that modulates the ions to control the ion potential or ion energy of the plasma 114. In various configurations, power sources 120, 122 are locked to operate at the same frequency, voltage, and current, with fixed or varying relative phases. In various other configurations, power sources 120, 122 may operate at different frequencies, voltages, and currents, and relative phases.

FIG. 2 depicts a representation of a capacitively coupled plasma (CCP) system 210. CCP system 210 includes plasma chamber 212 for generating plasma 214. A pair of electrodes 216, 226 placed within plasma chamber 212 connect to respective DC ($\omega=0$) or RF power generators or power sources 220, 222. Electrode 226 supports a substrate or wafer (not shown) as described above with respect to FIG. 1. In various configurations, power source 220 provides a source voltage or current to ignite or generate plasma 214 or control the plasma density, although a bias power source may also be used to ignite a plasma. In various configurations, power source 222 provides a bias voltage or current that modulates the ions in the plasma to control the ion potential or ion energy of the plasma 214. In various CCP configurations, bias power and source power may be applied to the upper electrode, such as electrode 216, and the lower electrode, such as electrode 226, in various combinations. In another nonlimiting example, bias power and source power may be applied to a lower electrode, such as electrode 226, and the top electrode, such as electrode 216, is grounded or floating. In various RF configurations, power sources 220, 222 operate at relative phases when the sources are harmonically related. In various other configurations, power sources 220, 222 operate at different frequencies, voltages, and currents, with fixed or varying relative phases. Also in various configurations, power sources 220, 222 can be connected to the same electrode, while the counter electrode is connected to ground or to yet a third DC (ω=0) or RF power generator (not shown).

FIGS. 1 and 2 each show a conventional single bias electrode system in which respective bias electrodes 126, 226 are configured as a single electrode, as compared to multiple electrodes. In conventional single bias electrode systems, plasma 114, 214 may form as either a center-high density bulk plasma or a center-low density bulk plasma. FIG. 1 shows plasma 114 formed as a center high density bulk plasma, and FIG. 2 shows plasma 214 formed as a center-low density bulk plasma. Each bulk plasma results in a plasma sheath 130, 230 having one of a convex, concave shape, or other non-planar shape, none of which is parallel to the generally planar workpiece mounted to the surface of respective bias electrodes 126, 226. With respect to FIG. 1, plasma sheath 130 is displaced away from the electrode 126 in proximity to the edges of electrode 126 and is displaced toward electrode 126 in proximity to the center of electrode 126. This results in a non-uniform powered sheath thickness over the powered bias electrode. With respect to FIG. 2, plasma sheath 230 is displaced toward electrode 226 in proximity to the edges of electrode 226 and is displaced away from electrode 226 in proximity to the center of electrode 226. It should be recognized that in various configurations, the ICP system of FIG. 1 can generate either a center-high density bulk plasma or a center-low density bulk plasma. Likewise, it should be recognized that in various configurations, the CCP system of FIG. 2 can generate either a center-high density bulk plasma or a center-low density bulk plasma.

By way of nonlimiting example, as can be seen from FIGS. 1 and 2, a center high density bulk plasma 114 results in a plasma sheath 130 shaped as shown in FIG. 1, and a center low density bulk plasma 214 results in a plasma sheath 230 shaped as shown in FIG. 2. Thus, FIGS. 1 and 2 depict one example of how a single electrode results in the plasma sheath profile being non-planar across the substrate. In various other configurations, the sheath profile may be a complex shape over the substrate and electrode. The shape of plasma sheath 130, 230 depends upon waveform parameters such as voltage, power, frequency, and phase, and also on the electrode geometry, reactor geometry, and materials used during plasma processing. Controlling these parameters for a single electrode may not enable generation of a plasma that produces a generally flat plasma sheath, resulting in the plasma sheaths 130, 230 shown in respective FIGS. 1 and 2. In various configuration, a generally flat sheath profile may be achieved by adjusting electrode geometry, reactor geometry, materials used during plasma processing, or by addition of other components within the reactor.

A non-uniform bulk plasma that results in a plasma sheath that is non-planar results in an ion trajectory other than orthogonal to the single bias electrode, and the workpiece mounted to the bias electrode. As shown in FIG. 1, ion trajectories 132 are directed toward the edges of electrode 126. Conversely, ion trajectories 232 are directed away from the edge of bias electrode 226. When ions are directed in a trajectory other than orthogonally to electrodes 126, 226 (and the workpiece mounted thereon), the resultant etching in proximity to the edges of the workpiece becomes less uniform. Non-uniformity can also occur away from the edges of the workpiece, such as in a multi-coil ICP source which could generate a "W" shaped sheath profile leading to off-axis ions in places other than near the edge. While single bias electrode plasma etch systems have been primarily used in industry for many years, as device dimensions continue to decrease, less room for imperfections exists, such as may occur when ion trajectories are other than orthogonal to be biased electrode. Further, wafer uniformity and device yield in part define a successful high volume manufacturing (HVM) process.

To improve the etching process and improve non-orthogonal ion trajectories, etch systems with one or both multiple powered bias electrodes and source electrodes are implemented to provide uniformity and profile control to nearly the edge of the wafer. This control is enabled by adjusting the driving RF or pulsed DC (pDC) waveforms to achieve a uniform sheath thickness across the entire wafer. A uniform sheath thickness across the entire wafer causes ions to impinge on the substrate nearly orthogonally, or perpendicularly, to its surface. Waveform parameters such as voltage, power, frequency, phase, and the like must be empirically determined based on the particular recipe implemented in the plasma chamber. In addition to presenting significant challenges, the scheme lacks feedback and real time control.

The non-uniformities in the plasma sheath result from many aspects of the plasma generation system, including the geometric design of components, the interaction of the plasma radical generating source(s) and loss surfaces, the coatings and materials employed, the control methodology, and other aspects. Given the challenges to sufficiently model and simulate plasma reactors, there is need for a sensor that can provide real time feedback of relevant variables that characterize the plasma, such as ion energy and sheath thickness. Such a sensor measures the combined system response to a specific and controlled stimulus.

According to various aspects of the present disclosure, an IEDF sensor is placed in the RF/DC path of each electrode. The IEDF sensor provides real time feedback of variables that characterize the plasma, such as ion energy, IEDF, sheath thickness, sheath capacitance, node voltages, and the like. In various configurations, one or more of these variables from each IEDF sensor are used to control power, frequency, phase, etc. to maintain a composite, uniform sheath thickness across electrodes, as will be described in greater detail below.

Figure 3:
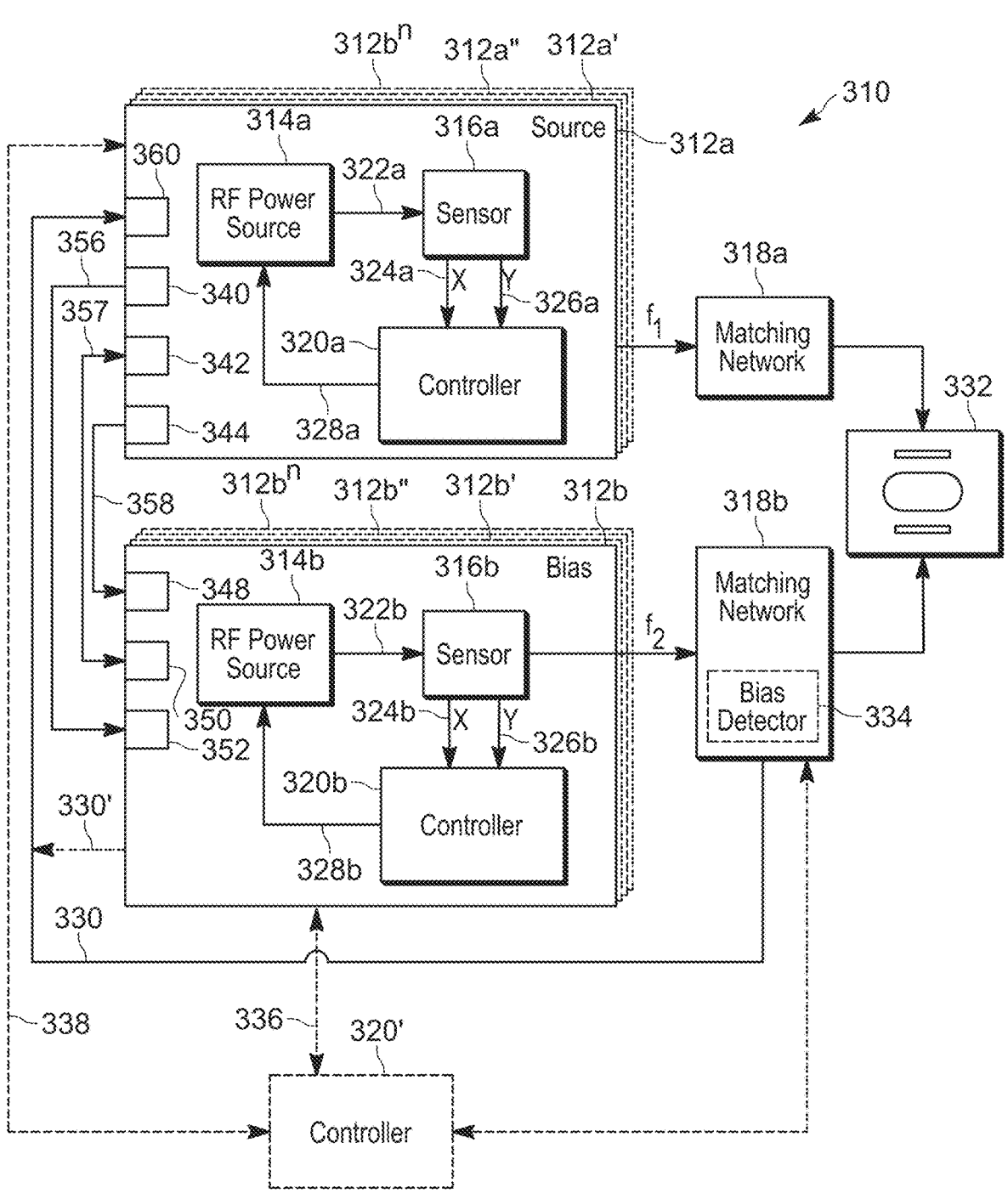
FIG. 3 is a schematic block diagram of a power delivery system having multiple power supplies arranged according to various configurations of the present disclosure.

FIG. 3 depicts a RF generator or power supply system 310. Power supply system 310 includes a pair of radio frequency (RF) generators or power supplies 312*a*, 312*b*, matching networks 318*a*, 318*b*, and load 332, such as a non-linear load, which may be a plasma chamber, plasma reactor, process chamber, and the like. In various configurations, RF generator 312*a* is referred to as a source RF generator or power supply, and matching network 318*a* is referred to as a source matching network. Also in various configurations, RF generator 312*b* is referred to as a bias RF generator or power supply, and matching network 318*b* is referred to as a bias matching network. It will be understood that the components can be referenced individually or collectively using the reference number with and without a letter, subscript, or a prime symbol.

In various configurations, source RF generator 312a receives a control signal 330 from matching network 318b, generator 312b, or a control signal 330' from bias RF generator 312b. Control signal 330 or 330' represents an input signal to source RF generator 312a that indicates one or more operating characteristics or parameters of bias RF generator 312b. In various configurations, a synchronization bias detector 334 senses the RF signal output from matching network 318b to load 332 and outputs synchronization or trigger signal 330 to source RF generator 312a. In various configurations, synchronization or trigger signal 330' may be output from bias RF generator 312b to source RF generator 312a, rather than trigger signal 330. One difference between trigger or synchronization signals 330, 330' may result from the effect of matching network 318b, which can vary the phase between the input signal to and output signal from matching network. Signals 330, 330' include information about the operation of bias RF generator 312b that in various configurations enables predictive responsiveness to address periodic fluctuations in the impedance of load 332 caused by the bias RF generator 312b. When control signals 330 or 330' are absent, RF generators 312a, 312b operate autonomously.

RF generators 312a, 312b include respective RF power sources or amplifiers 314a, 314b, sensors 316a, 316b, and processors, controllers, or control modules 320a, 320b. RF power sources 314a, 314b generate respective RF power signals 322a, 322b output to respective sensors 316a, 316b. Sensors 316a, 316b receive the output of RF power sources 314a, 314b and generate respective RF power signals $f_1$ and $f_2$. Sensors 316a, 316b also output signals that vary in accordance with various parameters sensed from load 332. While sensors 316a, 316b, are shown within respective RF generators 312a, 312b, sensors 316a, 316b can be located externally to RF power generators 312a, 312b. Such external sensing can occur at the output of the RF generator, at the input of an impedance matching device located between the RF generator and the load, or between the output of the impedance matching device (including within the impedance matching device) and the load.

Sensors 316a, 316b detect various operating parameters and output signals X and Y. Sensors 316a, 316b may include voltage, current, and/or directional coupler sensors. Sensors 316a, 316b may detect (i) voltage V and current I and/or (ii) forward power $P_{FWD}$ output from respective power amplifiers 314a, 314b and/or RF generators 312a, 312b and reverse or reflected power $P_{REV}$ received from respective matching network 318a, 318b or load 332 connected to respective sensors 316a, 316b. The voltage V, current I, forward power $P_{FWD}$, and reverse power $P_{REV}$ may be scaled, filtered, or scaled and filtered versions of the actual voltage, current, forward power, and reverse power associated with the respective power sources 314a, 314b. Sensors 316a, 316b may be analog or digital sensors or a combination thereof. In a digital implementation, the sensors 316a, 316b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 316a, 316b generate sensor signals X, Y, which are received by respective power controllers or control modules 320a, 320b. Control modules 320a, 320b process the respective X, Y signals 324a, 326a and 324b, 326b and generate one or a plurality of feedforward or feedback control signals 328a, 328b to respective power sources 314a, 314b. Power sources 314a, 314b adjust the RF power signals 322a, 322b based on the received one or plurality feedback or feedforward control signals. In various configurations, control modules 320a, 320b may control matching networks 318a, 318b, respectively, via respective control signals 328a, 328b. Control modules 320a, 320b may include, at least proportional-integral (PI), proportional-integral-derivative (PID) controllers, linear-quadratic-regulator (LQR), or subsets thereof and/or direct digital synthesis (DDS) component(s) and/or any of the various components described below in connection with the modules.

In various configurations, control modules 320a, 320b may include functions, processes, processors, or submodules. Control signals 328a, 328b may be control or drive signals may communicate DC offset or rail voltage, voltage or current magnitude, frequency, and phase components. In various configurations, feedback control signals 328a, 328b can be used as inputs to one or multiple control loops. In various configurations, the multiple control loops can include a control loop for RF drive, and for rail voltage. In various configurations, control signals 328a, 328b can be used in a single-input-single-output (SISO) or a multiple-input-multiple-output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein. In other configurations, signals 328a, 328b can provide feedforward control as described in U.S. Pat. No. 10,049,857, assigned to the assignee of the present application and incorporated by reference herein.

In various configurations, power supply system 310 can include controller 320'. Controller 320' may be disposed externally to either or both of RF generators 312a, 312b and may be referred to as external or common controller 320'. In various configurations, controller 320' may implement one or a plurality of functions, processes, or algorithms described herein with respect to one or both of controllers 320a, 320b. Accordingly, controller 320' communicates with respective RF generators 312a, 312b via a pair of respective links 336, 338 which enable exchange of data and control signals, as appropriate, between controller 320' and RF generators 312a, 312b. For the various configurations, controllers 320a, 320b, 320' can distributively and cooperatively provide analysis and control of RF generators 312a, 312b. In various other configurations, controller 320' can provide control of RF generators 312a, 312b, eliminating the need for the respective local controllers 320a, 320b.

In various configurations, RF power source 314a, sensor 316a, controller 320a, and matching network 318a can be referred to as source RF power source 314a, source sensor 316a, source controller 320a, and source matching network 318a. Similarly in various configurations, RF power source 314b, sensor 316b, controller 320b, and matching network 318b can be referred to as bias RF power source 314b, bias sensor 316b, bias controller 320b, and bias matching network 318b. In various configurations and as described above, the source term refers to the RF generator that generates a plasma, and the bias term refers to the RF generator that tunes the ion potential or IEDF of the plasma. In various configurations, the source and bias RF power supplies operate at different frequencies. In various configurations, the source RF power supply operates at a higher frequency than the bias RF power supply. In various other configurations, the source and bias RF power supplies operate at the same frequencies or substantially the same frequencies.

According to various configurations, source RF generator 312a and bias RF generator 312b include multiple ports to communicate externally. Source RF generator 312a includes pulse synchronization output port 340, digital communication port 342, and RF output port 344. Bias RF generator 312b includes RF input port 348, digital communication port 350, and pulse synchronization input port 352. Pulse synchronization output port 340 outputs pulse synchronization signal 356 to pulse synchronization input port 352 of bias RF generator 312b. Digital communication port 342 of source RF generator 312a and digital communication port 350 of bias RF generator 312b communicate via digital communication link 357. RF output port 344 generates RF control signal 358 input to RF input port 348. In various configurations, RF control signal 358 is substantially the same as the RF control signal controlling source RF generator 312a. In various other configurations, RF control signal 358 is the same as the RF control signal controlling source RF generator 312a, but is phase shifted within source RF generator 312a in accordance with a requested phase shift generated by bias RF generator 312b. Thus, in various configurations, source RF generator 312a and bias RF generator 312b are driven by substantially identical RF control signals or by substantially identical RF control signal phase shifted by a predetermined amount.

In various configurations, power supply system 310 may include multiple RF source generators 312a and multiple RF bias generators 312b. By way of nonlimiting example, a plurality of source RF generators 312a, 312a', 312a'', . . . , 312a" can be arranged to provide a plurality of output power signals to one or more source electrodes of load 332. Similarly, a plurality of bias RF generators 312b, 312b', 312b'', . . . , 312b" may provide a plurality of output power signals to a plurality of bias electrodes of load 332. When source RF generator 312a and bias RF generator 312b are configured to include a plurality of respective source RF generators or bias RF generators, each RF generator will output a separate signal to a corresponding plurality of matching networks 318a, 318b, configured to operate as described above, in a one-to-one correspondence. In various other configurations, there may not be a one-to-one correspondence between each RF generator and matching network. In various configurations, multiple source electrodes may refer to multiple electrodes that cooperate to define a composite source electrode. Similarly, multiple bias electrodes may refer to multiple connections to multiple electrodes that cooperate to define a composite bias electrode.

Figure 4:
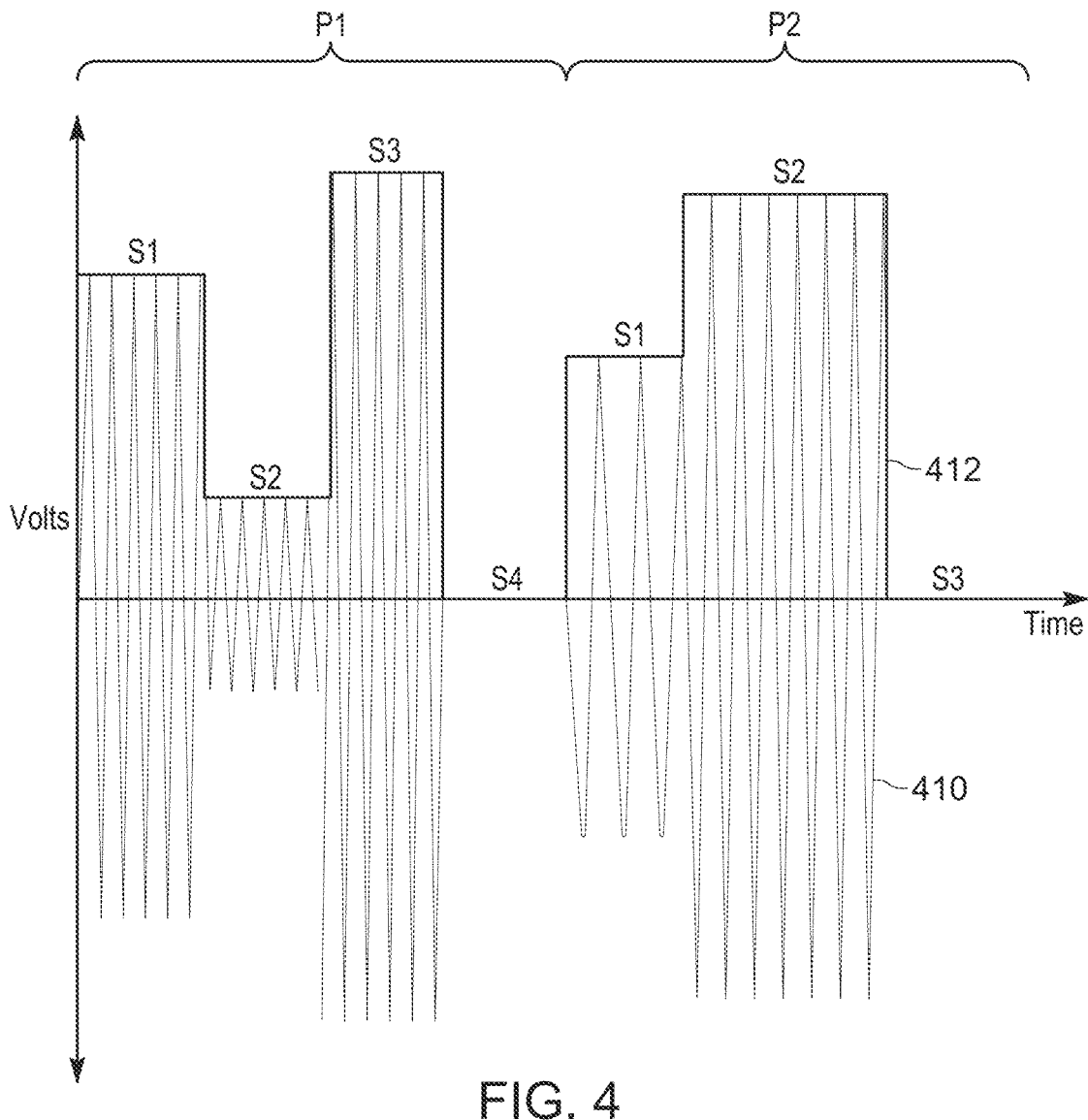
FIG. 4 shows waveforms of a RF signal and a pulse modulating the RF signal to describe a pulse mode of operation.

FIG. 4 depicts a plot of voltage versus time to describe a pulse or pulsed mode of operation for delivering power to a load, such as load 332 of FIG. 3. More particularly, FIG. 4 depicts two-multistate pulses P1, P2 of a pulse signal 412 having a respective plurality of states S1-S4 and S1-S3. In FIG. 4, RF signal 410 is modulated by pulses P1 and P2. As shown at states S1 of P1 and S1 of P2, when the pulses are ON, RF generator 312 outputs RF signal 410 having an amplitude defined by the pulse magnitude at each state. Conversely, during states S4 of P1 and S3 of P2, the pulses are OFF, and RF generator 312 does not output RF signal 410. Pulses P1, P2 can repeat at a constant duty cycle or a variable duty cycle, and states S1-S4, S1-S3 of each pulse P1, P2 may have the same or varying amplitudes and widths. Further, pulse signal 412 need not be a square wave as shown in FIG. 2. By way of non-limiting example, pulse signal 412 may be trapezoidal, triangular, gaussian, or other shape. Further yet, pulses P1, P2 can have multiple states S1, . . . , Sn of varying amplitude, duration, and shape. States S1, . . . , Sn may repeat within a fixed or variable period.

Also shown in FIG. 4, RF signal 410 operates at a frequency that varies between states or within a state.

Figure 5:
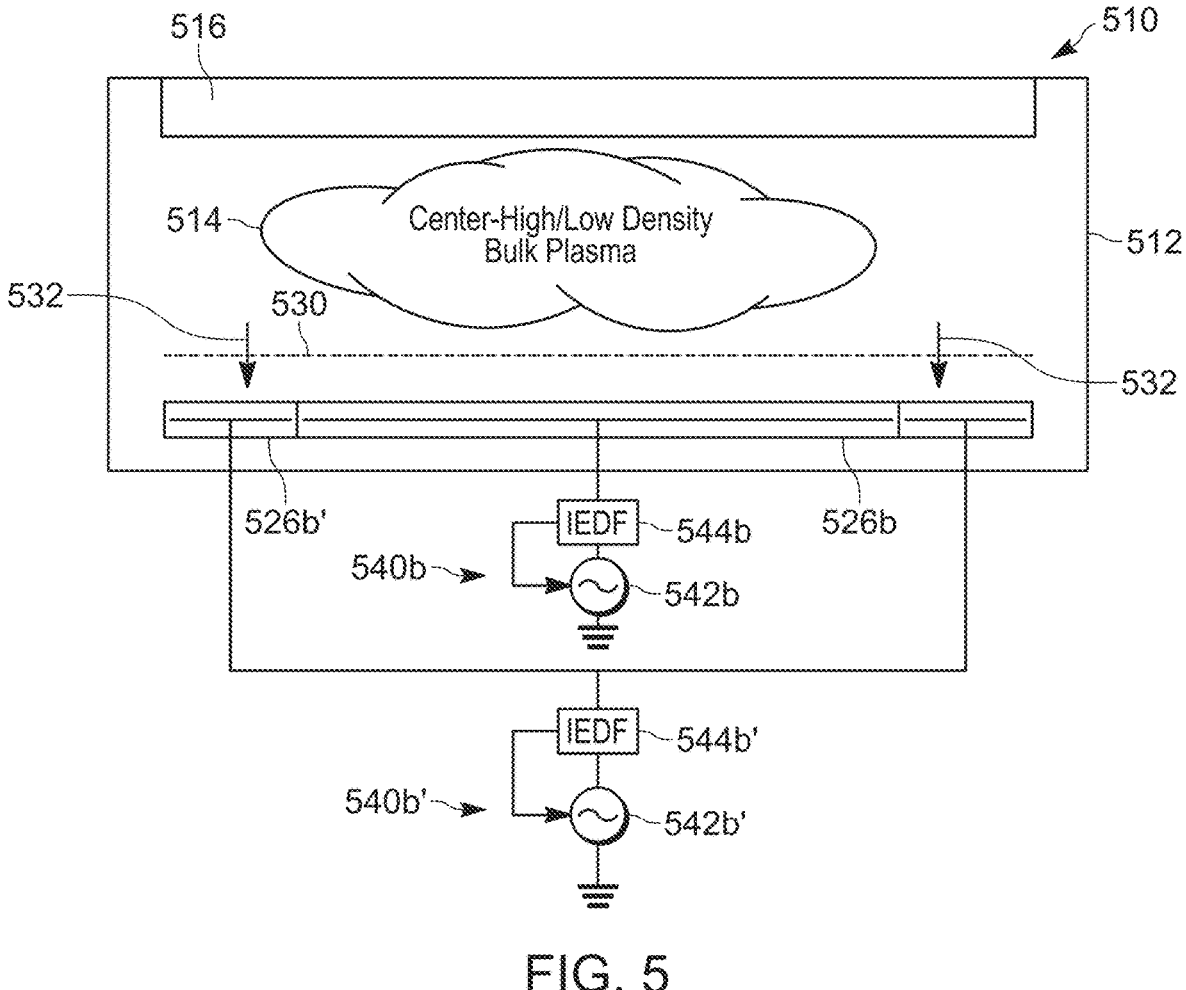
FIG. 5 shows a representation of a plasma system arranged in accordance with the principle of the present disclosure.

FIG. 5 shows plasma generation system 510. Plasma generation system 510 includes plasma chamber 512. Plasma 514 is generated within plasma chamber 512 by the application of source power to conductor 516. Conductor 516 may be implemented in either an inductively coupled plasma (ICP) or capacitively coupled plasma (CCP) configuration as described above with respect to FIGS. 1 and 2. Plasma 514 may be a center-high or center-low density bulk plasma. The configuration of FIG. 5 provides an apparatus to provide a generally uniform plasma sheath 530 by controlling RF generators that provide power to at least a pair of electrodes that cooperate to provide a bias electrode.

As shown in FIG. 5, bias electrode 526 includes a main bias electrode 526b and an auxiliary bias electrode 526b'. Main bias electrode 526b and auxiliary bias electrode 526b' cooperate to define bias electrode 526. Main bias electrode 526b defines a central portion of bias electrode 526, and auxiliary bias electrode 526b' defines a periphery of bias electrode 526. In various configurations, auxiliary bias electrode 526b' circumscribes the outer periphery of bias electrode 526. In various other configurations, bias electrode 526 can be subdivided into various shapes, including a plurality of rectangular, square, or other shaped sections, or generally circular sections being concentrically located about a central axis.

Main bias electrode 526b receives a RF power signal from main bias RF generator 540b. Main bias RF generator 540b includes a first RF power source or main bias RF power source 542b and main bias IEDF sensor 544b. Main bias RF power source 542b generates a RF output signal applied to main bias electrode 526b in accordance with one or plurality of input signals received from main bias IEDF sensor 544b. Similarly, auxiliary bias RF generator 540b' includes a second RF power source of auxiliary bias RF power source 542b' and auxiliary bias IEDF sensor 544b'. Auxiliary bias RF power source 542b' generates a RF output signal applied to auxiliary bias electrode 526b' in accordance with one or plurality of input signals received from auxiliary bias IEDF sensor 544b'. By controlling respective main bias electrode 526b and auxiliary bias electrode 526b' with power from respective main bias RF generator 540b and auxiliary bias RF generator 540b', ion trajectories 532 can be altered, as compared to FIGS. 1 and 2, to a generally orthogonal angle to a workpiece placed on bias electrode 526.

The elements of FIG. 5 may be substituted into FIG. 3 with bias RF generators 540b, 540b' substituted into respective bias RF generators 312b, 312b' of FIG. 3. With such a substitution, sensors 316b, 316b' (not shown) of FIG. 3 will be replaced by respective IEDF sensors 544b, 544b' of FIG. 5. Bias RF generators 540b, 540b' may be controlled by one or more controllers 320b, 320b' or respective RF generators 312b, 312b' as described in FIG. 3. Throughout the specification, main and auxiliary components can also be referenced as first and second components. Likewise, various control and sensor signals may be referenced as main and auxiliary control and sensor signals or first and second control and sensor signals.

Figure 6:
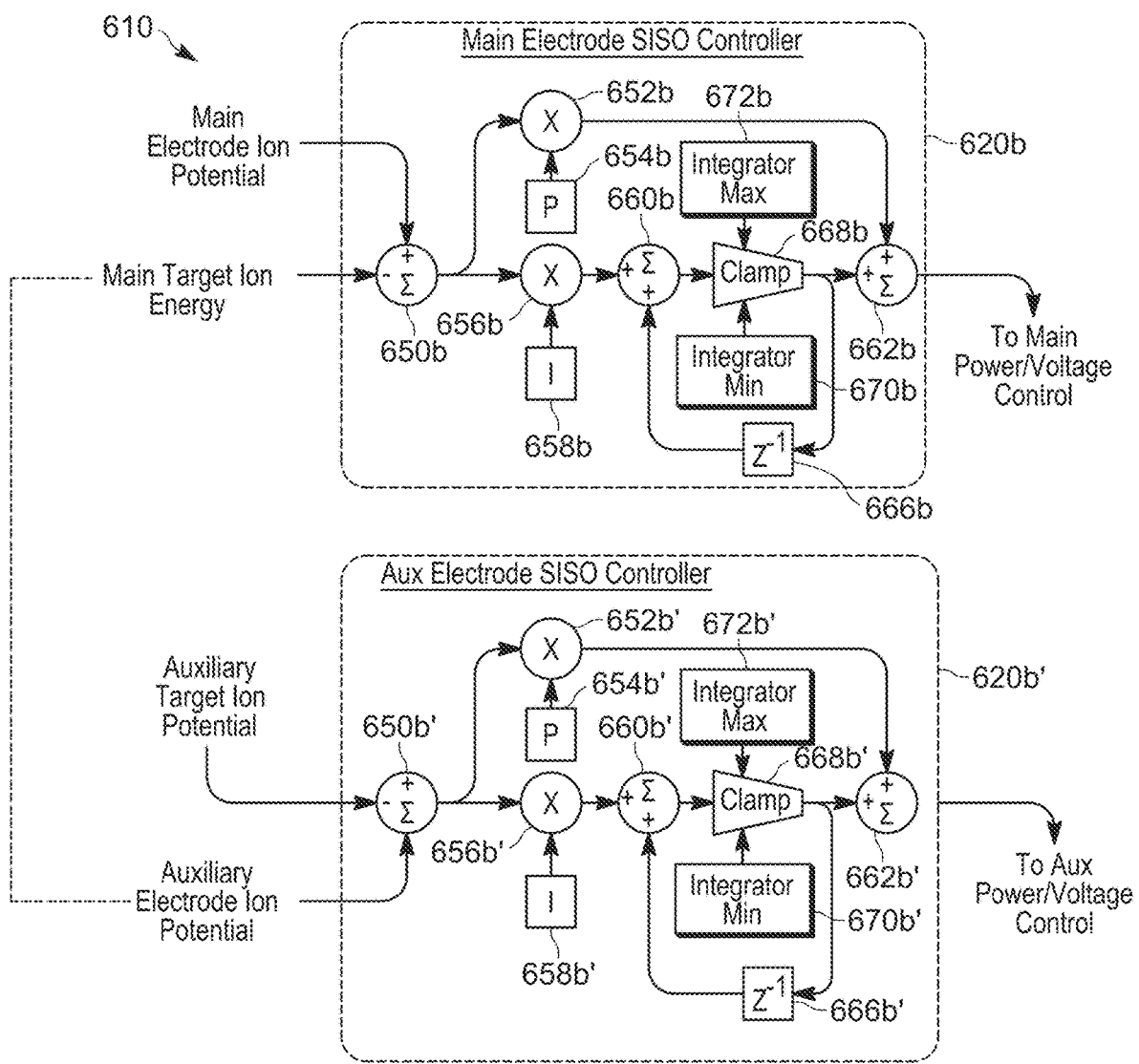
FIG. 6 shows a schematic block diagram of a pair of controllers that communicate control signals to RF generators.

FIG. 6 depicts a block diagram of RF power generation system 610 including a pair of RF generator controllers 620b, 620b', also referred to as respective main RF generator controller 620b and auxiliary RF generator controller 620b', arranged in accordance with the present disclosure. In various embodiments, main RF generator controller 620b represents a controller for an RF generator providing power to a main bias electrode of a load, such as main bias electrode 526b of FIG. 5. Similarly, in various embodiments, auxiliary RF generator controller 620b' represents a controller for an RF generator providing power to an auxiliary bias electrode of a load, such as auxiliary bias electrode 526b' of FIG. 5.

Main RF generator controller 620b includes summer 650b that receives at least a pair of inputs including a main bias electrode ion potential or energy, such as measured by main bias IEDF sensor 544b of FIG. 5, and a main target ion potential. The main target ion potential may be provided by a supervisory controller for the system and may be specified by the user. Similarly, auxiliary RF generator controller 620b' includes summer 650b' that receives at least a pair of inputs including an auxiliary ion potential, such as measured by auxiliary bias IEDF sensor 544b' of FIG. 5, and an auxiliary target ion potential. The auxiliary target ion potential may be provided by a supervisory controller for the system and may be specified by the user. In various configurations, the main target ion potential and the auxiliary target ion potential may be the same values, indicated by a dotted line in FIG. 6. Thus, only a single target ion energy they be provided to RF power generation system 610 and provided to respective summers 650b, 650b'.

Main RF generator controller 620b of RF power generation system 610 will be described herein. It should be understood that auxiliary RF generator controller 620b' of RF power generation system 610 operates similarly and will not be described in detail. Summer 650b outputs an IEDF error to respective proportional and integral sections of a proportional-integral (PI) controller. The proportional section of the PI controller includes combiner 652b that also receives a proportional coefficient P 654b. Combiner 652b outputs a proportional term to summer 662b. The integral section of the PI controller includes combiner 656b that also receives an integral coefficient I 658b. Combiner 656b outputs a combined value to summer 660b. Summer 660b also receives an integral feedback term from integrator 666b. The output from summer 660b is input to clamp 668b which clamps the output from summer 660b. The range for clamp 668b is defined by an integrator minimum term 670b and an integrator maximum term 672b. The output from clamp 668b is fed back to integrator 666b and is also output to summer 662b. As stated above, the output from integrator 666b is fed back to summer 662b. Summer 662b communicates a control signal to a main power control section of a RF generator. In various configurations, the control section may include one or plurality of drive actuators or controllers. As noted above, auxiliary RF generator controller 620b' is similarly configured, but receives an auxiliary ion energy signal input to summer 650b' and communicates a control signal to an auxiliary power control section of RF generator.

While described herein as a PI controller, main RF generator controller 620b and auxiliary RF generator controller 620b' may be individually configured as one or more of proportional-integral (PI), proportional-integral-derivative (PID), or linear-quadratic regulator (LQR) controller. Further, main RF generator controller 620b and auxiliary RF generator controller 620b' are shown and FIG. 5 as single-input-single-output (SISO) controllers. However, it should be recognized that one or both of main RF generator controller 620b and auxiliary RF generator controller 620b' may be configured as multiple-input-multiple-output (MIMO) controllers, as will be described herein.

Figure 7:
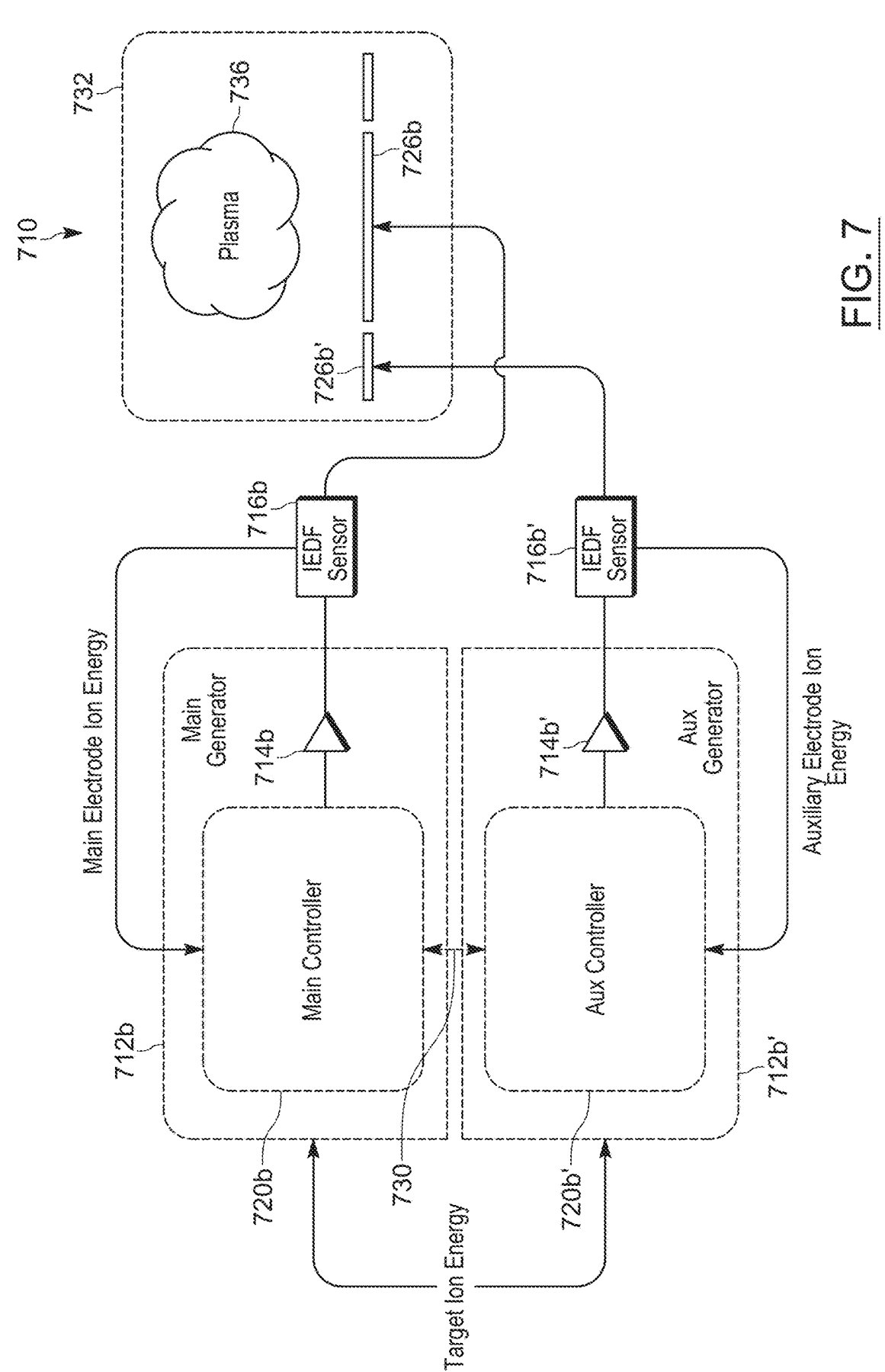
FIG. 7 shows a schematic block diagram of a pair of RF generators communicating to provide power to multiple electrodes of a set of electrodes of a load.

FIG. 7 is a schematic block diagram of a RF power generation system 710 including a pair of RF generators 712b, 712b' configured similarly as described above. RF generators 712b, 712b' communicates in order to coordinate power delivery to a load, such as plasma chamber 732. By way of nonlimiting example, in various configurations, RF generator 712b may be referred to as main RF generator 712b, and RF generator 712b' may be referred to as auxiliary RF generator 712b'. In various configurations, RF generators 712b, 712b' may be configured to power multiple electrodes of a plasma chamber that cooperate to define a bias electrode. Main RF generator 712b includes main RF amplifier or RF power source 714b which receives one or more control signals from main controller 720b. RF power source 714b communicates an output signal to main IEDF sensor 716b. Main IEDF sensor 716b communicates the output signal to main bias electrode 726b. Main IEDF sensor 716b also outputs one or a plurality of signals indicative of the IEDF associated with main bias electrode 726b to main bias controller 720b. Similarly, auxiliary RF generator 712b' includes auxiliary RF amplifier or RF power source 714b' which receives control signals from auxiliary controller 720b'. Auxiliary RF power source 714b' communicates an output signal to auxiliary bias IEDF sensor 716b'. Auxiliary bias IEDF sensor 716b' communicates the output signal to auxiliary bias electrode 726b'. Auxiliary bias IEDF sensor 716b' outputs one or plurality of signals indicative of the IEDF associated with auxiliary bias electrode to auxiliary bias controller 720b'.

Main controller 720b and auxiliary controller 720b' generate various control signals to respective main RF amplifier or RF power source 714b and auxiliary RF amplifier or RF power source 714b'. Main RF amplifier or RF power source 714b' and auxiliary RF amplifier or RF power source 714b' may each be configured to generate a continuous wave or pulsed RF signal. The control inputs or control parameters to each respective main RF power source 714b and auxiliary RF power source 714b' include one or more of a DC voltage or rail voltage, a low-level drive signal, a frequency, a phase, and one or more pulsing parameters. Thus, main controller 720b and auxiliary controller 720b' communicate one or a plurality of control signals to respective main RF power source 714b and auxiliary RF power source 714b' in accordance with the complexity of the RF power signal delivered to respective main bias electrode 726b and auxiliary bias electrode 726b'.

In various configurations, main controller 720b and auxiliary controller 720b' communicate via communications link 730. Communication between main controller 720b and auxiliary controller 720b' via communications link 730 enables coordination of power delivery to respective main bias electrode 726b and auxiliary bias electrode 726b' to better control the ion potential of plasma 736 and the powered sheath as described above. In various configurations, communications link 730 enables synchronization of one or more control parameters. By way of nonlimiting example, frequency, phase, and pulsing can be locked or synchronized between main RF generator 712b and auxiliary RF generator 712b', while the DC voltage or rail voltage may be controlled independently by each of main controller 720b and auxiliary controller 720b', or a subset of all parameters. In other configurations, no parameters, or all parameters, or a subset of all parameters may be locked or synchronized between RF generators 712b, 712b'.

Main IEDF sensor 716b and auxiliary IEDF sensor 716b' can be characterized generally as a plasma sensor. The plasma sensor may be configured to detect one or more parameters, such as voltage and current, or forward and reverse power, and generate one or more parameters that characterize the plasma. The parameters that characterize the plasma can include the plasma density ($n_o$), electron temperature ($T_e$), ion potential ($V_i$), sheath thickness (s), sheath capacitance ($c_s$), and IEDF. An example of a plasma sensor can be found with reference to U.S. patent application Ser. No. 17/715,672, filed on Apr. 7, 2022, entitled Real-Time, Non-Invasive IEDF Plasma Sensor, assigned to the assignee of the present application, and incorporated by reference herein.

Figure 8:
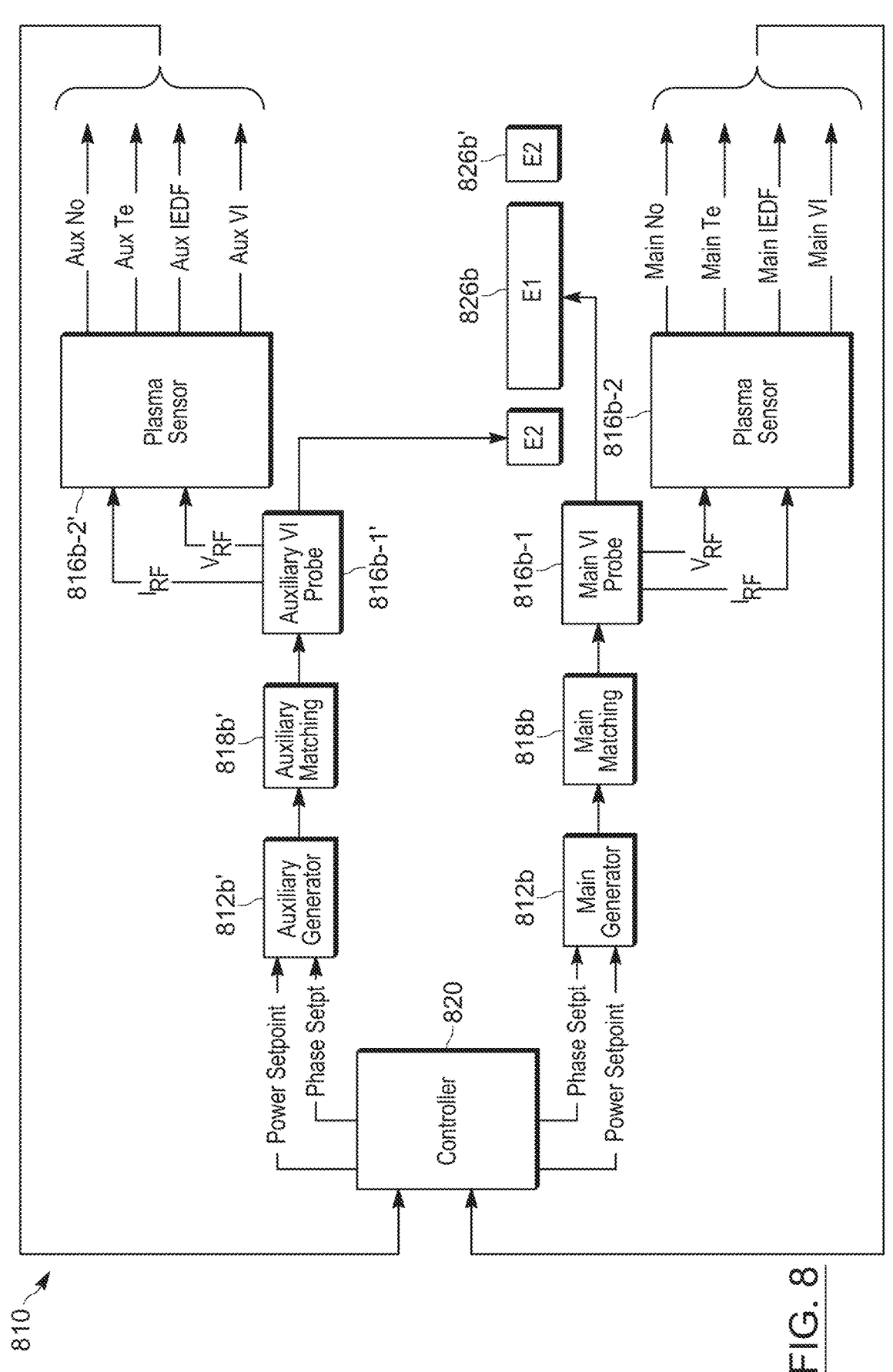
FIG. 8 shows a schematic block diagram of a pair of RF generators and a common controller configured to communicate control inputs to each of the pair of RF generators to communicate power to multiple electrodes of a set of electrodes of a load.

FIG. 8 shows plasma generation system 810 for controlling a main bias electrode and an auxiliary bias electrode of a plasma chamber. Plasma generation system 810 includes a common controller 820 that communicates control signals to respective RF generators, including main RF generator 812*b* and auxiliary RF generator 812*b*'. In various configurations, controller 820 outputs power setpoint and phase setpoint commands or signals to respective RF generators 812*b*, 812*b*'. Main RF generator 812*b* receives the power setpoint and phase setpoint inputs and generates an RF output signal, as described above. As also described above, the output from main RF generator 812*b* is input to main matching network 818*b*, which operates as described above. The output from the main matching network 818*b* is input to main VI probe 816*b*-1. VI probe 816*b*-1 outputs a RF voltage ($V_{RF}$) and RF current ($I_{RF}$) to plasma sensor 816*b*-2. Plasma sensor 816*b*-2 operates as described above, and one or more signals are fed back to controller 820. Controller 820 generates the respective power setpoints and phase setpoint in accordance with the signals fed back to controller 820.

As shown in FIG. 8, VI probe 816*b*-1 and plasma sensor 816*b*-2 cooperate to effect the sensor function described above, such as with respect to sensor 316*b* of FIG. 3. VI probe 816*b*-1 also communicates the RF signal to main bias electrode 826*b*. VI probe 816*b*-1 may also be implemented as a directional coupler or may detect other parameters from which plasma sensor 812*b*-2 can determine parameters that characterize the plasma. It should be understood that auxiliary bias electrode 826*b*' is driven similarly, wherein similar components of the auxiliary drive section of FIG. 8 operate as described above in connection with the main power supply section described herein.

In FIG. 8, VI probes 816*b*-1, 816*b*-1' operate as probes for detecting one or more of voltage ($V_{RF}$) and RF current ($I_{RF}$). VI probes 816*b*-1, 816*b*-1' output the detected parameters to respective plasma sensors 816*b*-2, 816*b*-2'. Thus, VI probes 816*b*-1, 816*b*-1' and respective plasma sensors 816*b*-2, 816*b*-2' cooperate to effect a sensor of parameters that characterize the plasma, as described above. One or more of the parameters include plasma density ($n_o$), electron temperature ($T_e$), ion potential ($V_i$), sheath thickness (s), sheath capacitance ($c_s$), IEDF, voltage (V), and current (I) which may be input to controller 820. Controller 820 communicates the respective voltage setpoint and phase setpoint to respective main RF generator 812*b* and auxiliary RF generator 812*b*'. Other control signals or command output by controller 820 to respective RF generators 812*b*, 812*b*' include pulse rate, duty cycle, and number of pulse states In various configurations, selected ones of the plasma parameters input to controller 820 may be used in accordance with particular control schemes. By way of nonlimiting example, IEDF information from respective plasma sensors 816*b*-2, 816*b*-2' may be input to controller 820. Feedback of main and auxiliary IEDF information, corresponding to IEDF related to respective main bias electrode 826*b* and auxiliary bias electrode 826*b*', may be used in applications relying on the IEDF histogram or in machine learning applications. In other configurations, ion potential ($V_i$) from respective plasma sensors 816*b*'', 816*b*''' may be communicated to controller 820. Feedback of main and auxiliary ion potentials ($V_i$), corresponding to ion potential ($V_i$) related to respective main bias electrode 826*b* and auxiliary bias electrode 826*b*', may be used in applications relying on time domain control or pulse shaping. The configuration of FIG. 8 provides an example of RF power generation system having a controller implementing a SISO control approach.

Figure 9:
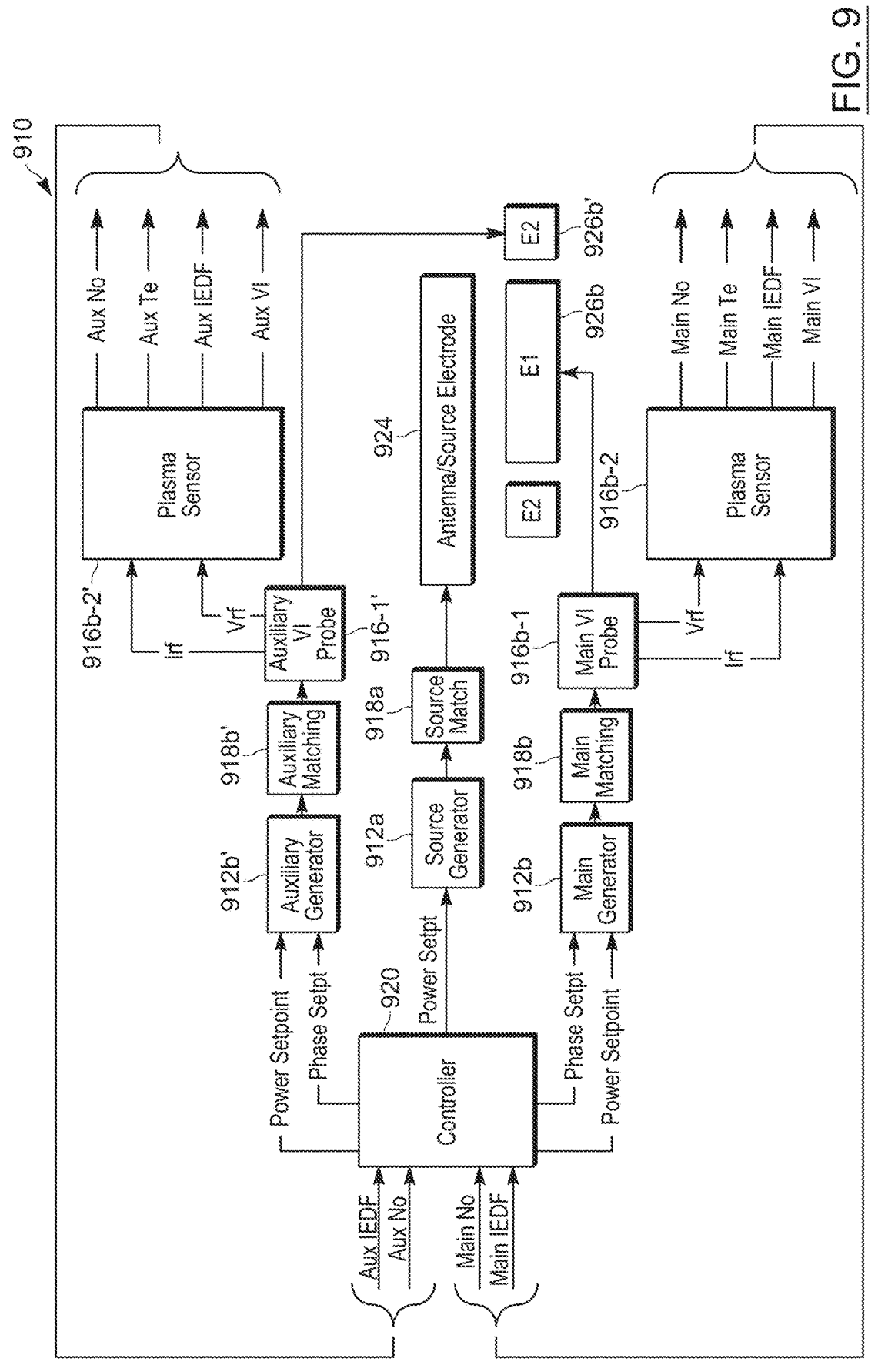
FIG. 9 shows a schematic block diagram of a pair of RF generators and a common controller configured to communicate control inputs to each of the pair of RF generators to provide energy to multiple electrodes of a set of electrodes of a load and to communicate to a third electrode providing power to the load.

FIG. 9 shows a RF power generator system 910 according to various configurations of the present disclosure. RF power generator system 910 is configured similarly to FIG. 8, and further includes RF source generator 912*a*. RF source generator 912*a* receives a power setpoint command from controller 920. Controller 920 communicates a power setpoint command to RF source generator 912*a* based, in part, on feedback signals received from plasma sensors 916*b*-2, 916*b*-2'. RF source generator 912*a* outputs a RF signal to matching network 918*a*. Matching network 918*a* provides a matching function as described above in order to provide an impedance match between RF source generator 912*a* and antenna/source electrode 924 of the plasma chamber. In the configuration of FIG. 9, controller 920 provides a power command that varies in accordance with parameters that characterize the plasma at bias electrodes 926*b*, 926*b*'. In this manner, both the plasma density and the ion voltage can be controlled in accordance with parameters sensed by plasma sensors 916*b*-2, 916*b*-2'. Varying the output of RF source generator 912*a* controls plasma density, and varying the output of RF bias generators 912*b*, 912*b*' controls ion potential. RF power generation system 910 provides improved control over the plasma. In various configurations, main plasma sensor 816*b*-2 outputs ion potential ($V_i$) and IEDF to controller 920. Similarly, In various configurations, auxiliary plasma sensor 916*b*-2' outputs ion potential ($V_i$) and IEDF to controller 920. In various other configurations, other parameters characterizing the plasma can be communicated to controller 920. FIG. 9 thus provides an example of RF power generation system having a controller implementing a MIMO control approach.

Figure 10:
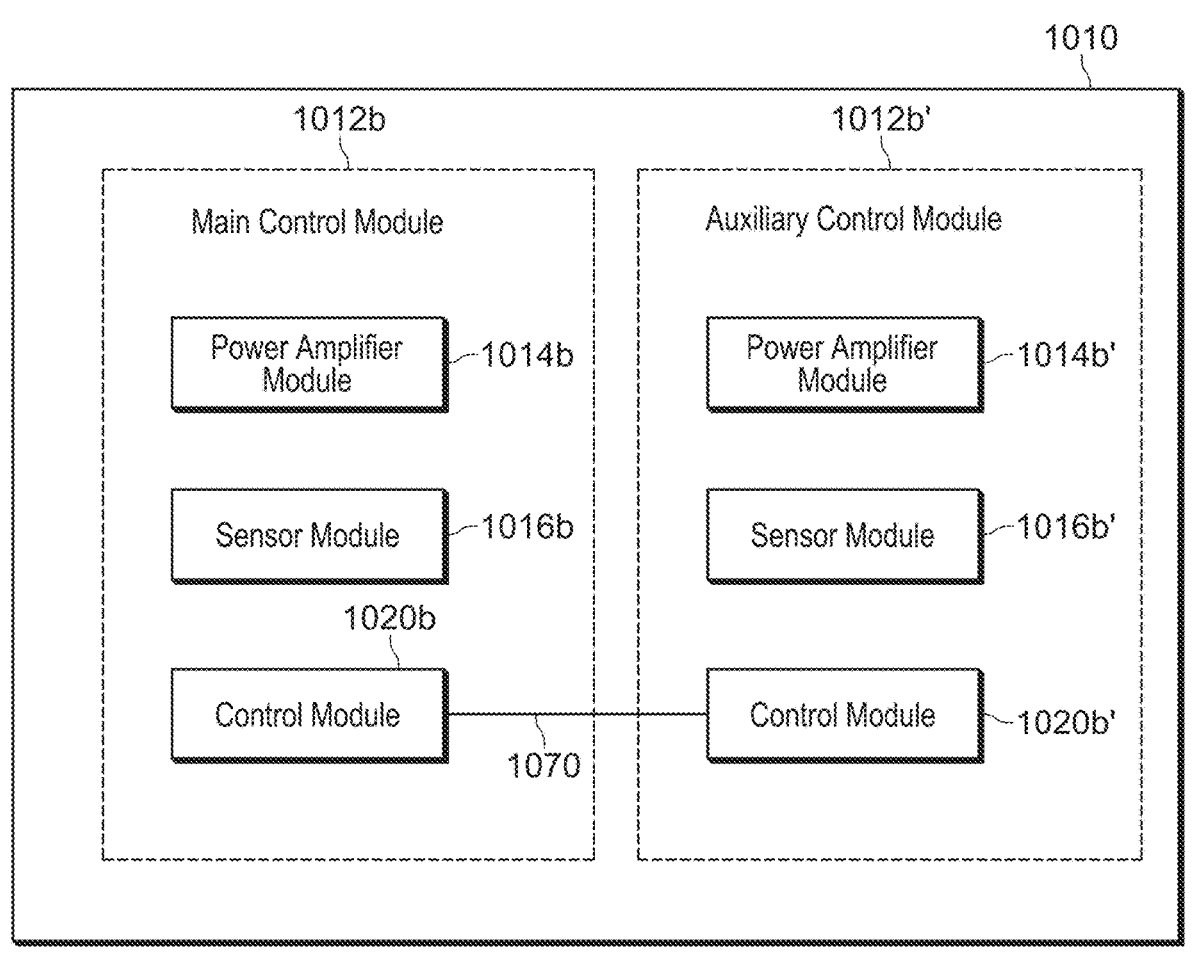
FIG. 10 shows a functional block diagram of an example control module arranged in accordance with various configurations.

FIG. 10 incorporates various components of FIGS. 1-9. Control module 1010 includes main power generation module section 1012*b* and auxiliary power generation module section 1012*b*'. Main power generation module section 1012*b* includes power amplifier module 1014*b*, sensor module 1016*b*, and control module 1020*b*. Auxiliary power generation module section 1012*b*' includes power amplifier module 1014*b*', sensor module 1016*b*', control module 120*b*'. Control modules 1020*b*, 1020*b*' may communicate via a communications link 1070 and may be consolidated into a single processor or distributed across multiple processors. In various configurations, control module 1010 includes one or a plurality of processors that execute code associated with the module sections or modules Imo, 1012*b*, 1012*b*', 1014*b*, 1016*b*, 1016*b*', 1020*b*, and 1020*b*'. Operation of the module sections or modules 1010, 1012*b*, 1012*b*', 1014*b*, 1016*b*, 1016*b*', 1020*b*, and 1020*b*'. is described below with respect to the method of FIG. 11.

For further defined structure of controllers described above, see the below provided flow chart of FIG. 11 and the below provided definition for the term "module". The systems disclosed herein may be operated using numerous methods, examples, and various control system methods of which are illustrated in FIGS. 3-9. Although the following operations are primarily described with respect to the implementations of FIG. 3-9, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 11:
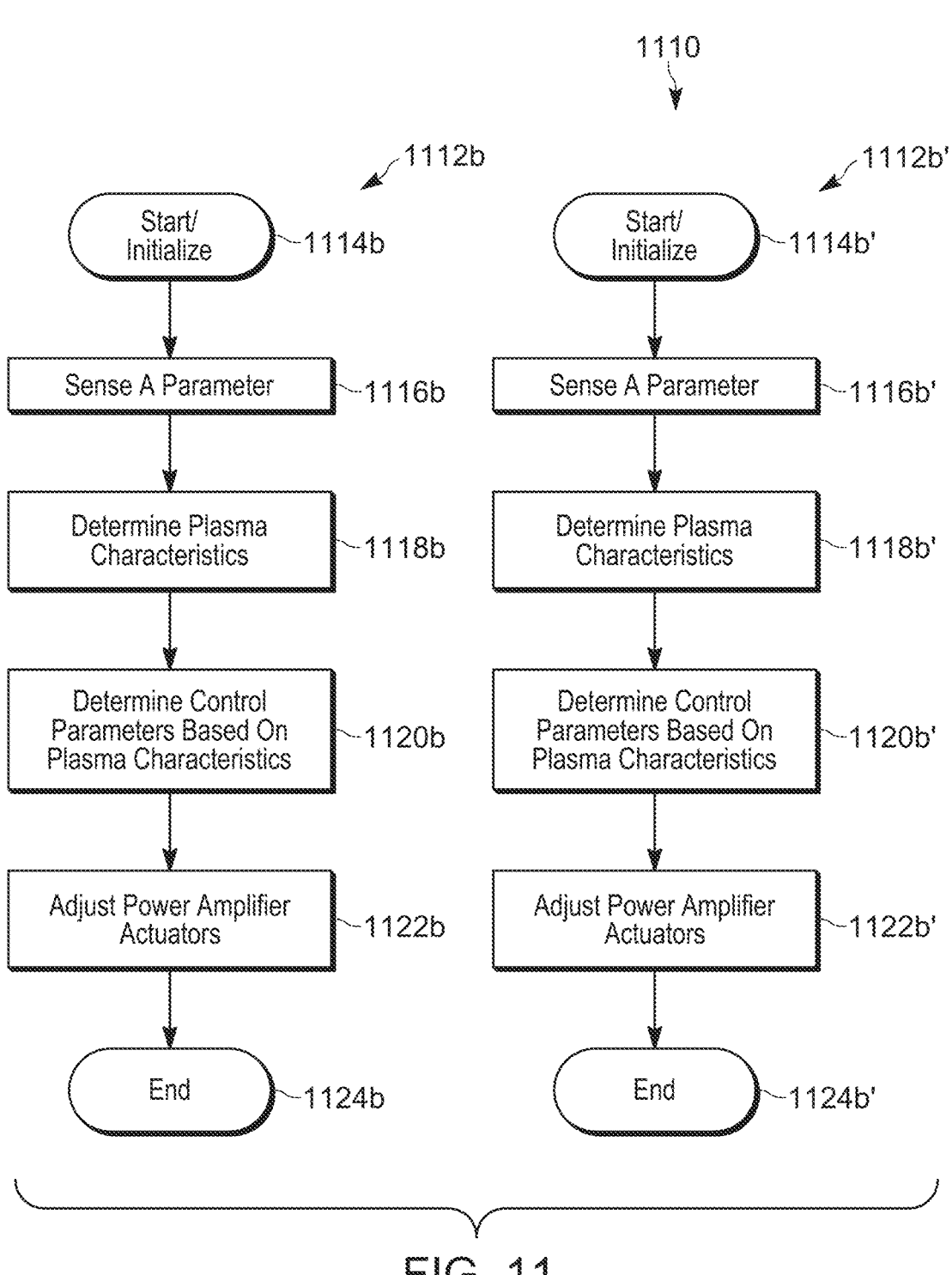
FIG. 11 shows a flow chart of operation of a control system arranged in accordance with the principals of the present disclosure.

FIG. 11 shows a flow chart of a control system 1110 for controlling RF power generation, for example, the power delivery systems of FIG. 3-9. Control system 1110 includes control section 1112*b* for a main RF power generator, such as for powering a main bias electrode of a plasma system, and control section 1112*b'* for an auxiliary bias electrode of a plasma system, such as for powering an auxiliary bias electrode of a plasma system. In control section 1112*b*, control begins at block 1114*b* and continues to sense a parameter or parameters at block 1116*b*. From the sensed parameter or parameters, a plasma characteristic or characteristics are determined at block 1118*b*. The plasma characteristic or characteristics are then used to determine control of plasma parameters at block 1120*b*. Control then proceeds to block 1122*b*, which controls a power source or supply to adjust the power applied to a main bias electrode. Control terminates at block 1124*b*. Control system 1110 includes control section 1112*b'* for an auxiliary RF power generator, such as for powering an auxiliary bias electrode of a plasma system. Control section 1112*b'* operates similarly to control section 1112*b*.

The system and methods described herein may, in various configurations, provide one or more of the following advantages. The system and method described herein may improve etch uniformity control. The system and method described herein may improve die yield. The system and method described herein may also eliminate the need for empirical mapping on a per recipe basis. The system and method described herein may also provide ion energy control, real time compensation of system dynamics, sheath thickness feedback and compensation, and facilitate implementation of normally complex control schemes.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. RF generator comprising:
a first RF power source configured to output a first RF output signal to a first electrode of a load;
a first plasma sensor for detecting a first parameter of the first RF output signal and determining a first characteristic of a plasma in the load;
a second RF power source configured to output a second RF output signal to a second electrode;
a second plasma sensor for detecting a second parameter of the second RF output signal and determining a second characteristic of a plasma in the load;
a RF power controller configured to receive the first characteristic and the second characteristic and to generate a first control signal and configured to generate a second control signal; and
a third RF power source configured to output a third RF output signal to a third electrode, and the RF power controller is further configured to generate a third control signal to vary the third RF output signal,
wherein the first control signal adjusts the first RF output signal, and the second control signal adjusts the second RF output signal.

2. The RF generator of claim 1 wherein:

the first characteristic is at least one of a plasma density, an electron temperature, an ion potential, a sheath thickness, a sheath capacitance, or an ion energy distribution function (IEDF) associated with the first electrode; and the second characteristic is at least one of the plasma density, the electron temperature, the ion potential, or the ion energy distribution function (IEDF) associated with the second electrode.

3. The RF generator of claim 1 wherein the first characteristic is an IEDF associated with the first electrode.

4. The RF generator of claim 1 wherein the second characteristic is an IEDF associated with the second electrode.

5. The RF generator of claim 1 wherein the first characteristic is an IEDF associated with the first electrode, and the second characteristic is the IEDF associated with the second electrode.

6. The RF generator of claim 1 wherein the RF power controller comprises a first power controller and a second power controller, wherein the first power controller is configured to receive the first characteristic and to generate a first control signal to vary the first RF output signal, and the second power controller is configured to receive the second characteristic and to generate a second control signal to vary the second RF output signal.

7. The RF generator of claim 6 further comprising a communication link between the first power controller and the second power controller, and the first power controller and the second power controller are configured to communicate a setting that defines the respective first RF output signal and the second RF output signal.

8. The RF generator of claim 1 wherein the first RF power source is a main bias power source and the first electrode is a main bias electrode, and the second RF power source is an auxiliary bias power source and the second electrode is an auxiliary bias electrode, wherein the main bias electrode and the auxiliary bias electrode form a composite bias electrode.

9. The RF generator of claim 1 wherein the first control signal controls at least one of a rail voltage, a drive, a frequency, a phase, or a pulsing of the first RF output signal, and the second control signal controls at least one of a rail voltage, a drive, a frequency, a phase, or a pulsing of the second RF output signal.

10. The RF generator of claim 1 wherein the RF power controller is configured to generate the third control signal, and the third control signal is varied in accordance with at least one of the first characteristic or the second characteristic.

11. The RF generator of claim 10 wherein the third RF power source is a source power source, and the third electrode is a source electrode.

12. The RF generator of claim 1, wherein the first RF output signal is a time varying signal.

13. The RF generator of claim 12, wherein the first RF output signal is a periodic signal and consists of a fundamental signal plus harmonics.

14. The RF generator of claim 1, wherein the second RF output signal is a time varying signal.

15. The RF generator of claim 14, wherein the second RF output signal is a periodic signal and consists of a fundamental signal plus harmonics.

16. A RF system comprising:

a main bias RF generator, including:

a main bias power source configured to output a main bias RF output signal to a main bias electrode of a load;

a main bias plasma sensor configured to detect a main bias parameter of the main bias RF output signal and to determine a main bias characteristic of a plasma in the load;

an auxiliary bias RF generator, including:

an auxiliary bias RF power source configured to output an auxiliary bias RF output signal to an auxiliary bias electrode;

an auxiliary bias plasma sensor configured to detect an auxiliary bias parameter of the auxiliary bias RF output signal and to determine an auxiliary bias characteristic of a plasma in the load;

a source RF power source configured to output a source RF output signal to a source electrode; and a RF power controller configured to receive the main bias characteristic and the auxiliary bias characteristic and to generate a main bias control signal to vary the main bias RF output signal and configured to generate an auxiliary bias control signal to vary the auxiliary bias RF output signal, wherein the RF power controller is further configured to generate a source control signal to vary the source RF output signal.

17. The RF system of claim 16 wherein the RF power controller is one of a proportional-integral controller, a proportional-integral-derivative controller, or a linear-quadratic-regulator controller.

18. The RF system of claim 16 wherein:

the main bias plasma sensor includes one of a VI probe or directional coupler to detect the main bias parameter; and the auxiliary bias plasma sensor includes one of a VI probe or directional coupler to detect the auxiliary bias parameter.

19. The RF system of claim 16 wherein:

the main bias characteristic is one of plasma density, electron temperature, ion potential, a sheath thickness, a sheath capacitance, or ion energy distribution function (IEDF) associated with the main bias electrode; and the auxiliary bias characteristic is one of plasma density, electron temperature, ion potential, or ion energy distribution function (IEDF) associated with the auxiliary bias electrode.

20. The RF system of claim 16 wherein the RF power controller comprises a main bias power controller and an auxiliary bias power controller, wherein the main bias power controller is configured to receive the main bias characteristic and to generate the main bias control signal in accordance with the main bias characteristic, and the auxiliary bias power controller is configured to receive the auxiliary bias characteristic and to generate the auxiliary bias control signal in accordance with the main bias characteristic.

21. The RF system of claim 16 wherein the main bias electrode and the auxiliary bias electrode form a composite bias electrode.

22. The RF system of claim 16 wherein the main bias control signal controls at least one of a rail voltage, a drive, a frequency, a phase, or a pulsing of the main bias RF output signal, and the auxiliary bias control signal controls at least one of a rail voltage, a drive, a frequency, a phase, or a pulsing of the auxiliary bias RF output signal.

23. The RF system of claim 16 wherein:

one of the main bias characteristic and the auxiliary bias characteristic includes a plurality of plasma density, electron temperature, ion potential, or ion energy distribution function (IEDF) associated with the respective main bias electrode and the auxiliary bias electrode; and the other of the main bias characteristic and the auxiliary bias characteristic includes a plurality of plasma density, electron temperature, ion potential, or ion energy distribution function (IEDF) associated with other of the respective main bias electrode and the auxiliary bias electrode.

24. The RF system of claim 16 wherein:

one of the main bias characteristic and the auxiliary bias characteristic includes a plurality of plasma density, electron temperature, ion potential, or ion energy distribution function (IEDF) associated with the respective main bias electrode and the auxiliary bias electrode; and the other of the main bias characteristic and the auxiliary bias characteristic includes a plurality of plasma density, electron temperature, ion potential, or ion energy distribution function (IEDF) associated with other of the respective main bias electrode and the auxiliary bias electrode.

25. The RF system of claim 16 wherein the RF power controller is configured to generate the source control signal, and the source control signal is varied in accordance with at least one of the main bias characteristic or the auxiliary bias characteristic.

26. The RF system of claim 16 wherein the main bias characteristic is an IEDF associated with the main bias electrode.

27. The RF system of claim 16 wherein the auxiliary bias characteristic is an IEDF associated with the auxiliary bias electrode.

28. The RF system of claim 16 wherein the main bias characteristic is an IEDF associated with the main bias electrode, and the auxiliary bias characteristic is the IEDF associated with the auxiliary bias electrode.

29. A non-transitory computer-readable medium storing processor-executable instructions, the instructions comprising generating a source RF output signal to a source electrode and generating a source control signal to vary the source RF output signal;

generating a main bias RF output signal to a main bias electrode of a load;

detecting a main bias parameter of the main bias RF output signal and determining a main bias characteristic of a plasma in the load;

generating an auxiliary bias RF output signal to an auxiliary bias electrode of a load;

detecting an auxiliary bias parameter of the auxiliary bias RF output signal and determining an auxiliary bias characteristic of a plasma in the load;

receiving the main bias characteristic and the auxiliary bias characteristic and generating a main bias control signal to vary the main bias RF output signal in accordance with the main bias parameter and generating an auxiliary bias control signal to vary the auxiliary bias RF output signal in accordance with the main bias characteristic, wherein the main bias control signal adjusts the main bias RF output signal, and the auxiliary bias control signal adjusts the auxiliary bias RF output signal.

30. The non-transitory computer-readable medium storing processor-executable instructions of claim 29, wherein:

the main bias characteristic is at least one of plasma density, electron temperature, ion potential, a sheath thickness, a sheath capacitance, or ion energy distribution function (IEDF) associated with the main bias electrode; and the auxiliary bias characteristic is at least one of plasma density, electron temperature, ion potential, a sheath thickness, a sheath capacitance, or ion energy distribution function (IEDF) associated with the auxiliary bias electrode.

31. The non-transitory computer-readable medium storing processor-executable instructions of claim 29, wherein the main bias electrode and the auxiliary bias electrode form a composite bias electrode.

32. The non-transitory computer-readable medium storing processor-executable instructions of claim 29 wherein the main bias control signal controls at least one of rail voltage, drive, frequency, phase, or pulsing of the main bias RF output signal, and the auxiliary bias control signal controls at least one of rail voltage, drive, frequency, phase, or pulsing of the auxiliary bias RF output signal.

33. The non-transitory computer-readable medium storing processor-executable instructions of claim 29 wherein:

one of the main bias characteristic and the auxiliary bias characteristic includes at least two of plasma density, electron temperature, ion potential, or ion energy distribution function (IEDF) associated with the respective main bias electrode and the auxiliary bias electrode; and the other of the main bias characteristic and the auxiliary bias characteristic includes at least one of plasma density, electron temperature, ion potential, or ion energy distribution function (IEDF) associated with other of the respective main bias electrode and the auxiliary bias electrode.

34. The non-transitory computer-readable medium storing processor-executable instructions of claim 29 wherein:

one of the main bias characteristic and the auxiliary bias characteristic includes a plurality of plasma density, electron temperature, ion potential, or ion energy distribution function (IEDF) associated with the respective main bias electrode and the auxiliary bias electrode; and the other of the main bias characteristic and the auxiliary bias characteristic includes a plurality of plasma density, electron temperature, ion potential, or ion energy distribution function (IEDF) associated with other of the respective main bias electrode and the auxiliary bias electrode.

35. The non-transitory computer-readable medium storing processor-executable instructions of claim 29, the instructions further comprising varying the source control signal in accordance with at least one of the main bias characteristic or the auxiliary bias characteristic.

36. A plasma generation system comprising:

a plasma chamber having a first electrode and a second electrode;

a first RF power source configured to output a first RF output signal to the first electrode;

a first plasma sensor for detecting a first parameter of the first RF output signal and determining a first characteristic of a plasma in the plasma chamber;

a second RF power source configured to output a second RF output signal to the second electrode;

a second plasma sensor for detecting a second parameter of the second RF output signal and determining a second characteristic of a plasma in the plasma chamber; and a third RF power source configured to output a third RF output signal to a third electrode, a RF power controller configured to receive the first characteristic and the second characteristic and to generate a first control signal and a second control signal, wherein the RF power controller is further configured to configured generate a third control signal, and wherein the first control signal adjusts the first RF output signal and the second control signal adjusts the second RF output signal, and the third control signal adjusts the third RF output signal.

* * * * *